United States Patent
Ballandras

(10) Patent No.: US 9,459,156 B2
(45) Date of Patent: Oct. 4, 2016

(54) TEMPERATURE SENSOR COMPRISING A HIGH-OVERTONE BULK ACOUSTIC RESONATOR

(75) Inventor: Sylvain Jean Ballandras, Besancon (FR)

(73) Assignees: CENTRE NATIONAL DE LA RECHERCHE SCIENTIFIQUE (C.N.R.S.), Paris (FR); UNIVERSITE DE FRANCHE-COMTE, Besancon (FR)

( * ) Notice: Subject to any disclaimer, the term of this patent is extended or adjusted under 35 U.S.C. 154(b) by 609 days.

(21) Appl. No.: 13/980,421

(22) PCT Filed: Jan. 18, 2012

(86) PCT No.: PCT/EP2012/050703
§ 371 (c)(1),
(2), (4) Date: Oct. 7, 2013

(87) PCT Pub. No.: WO2012/098156
PCT Pub. Date: Jul. 26, 2012

(65) Prior Publication Data
US 2014/0023109 A1    Jan. 23, 2014

(30) Foreign Application Priority Data

Jan. 21, 2011    (FR) ..................................... 11 50476

(51) Int. Cl.
H03B 5/30    (2006.01)
G01K 11/26    (2006.01)
H03H 9/15    (2006.01)

(52) U.S. Cl.
CPC ............. G01K 11/26 (2013.01); G01K 11/265 (2013.01); H03H 9/15 (2013.01)

(58) Field of Classification Search
CPC ........... H03H 9/0207; H03H 9/02031; H03H 9/02047; H03H 9/02078; H03H 9/172; H03H 9/15; G01K 11/26; G01K 11/265
USPC ........ 333/187, 191; 331/154, 107 A, 116 M; 310/357, 320; 29/25.35

IPC ........................................... G01K 11/26,11/265
See application file for complete search history.

(56) References Cited

U.S. PATENT DOCUMENTS

| 2007/0040473 A1 | 2/2007 | Ballandras et al. |
| 2011/0210802 A1 | 9/2011 | Ballandras et al. |
| 2011/0279187 A1* | 11/2011 | Ballandras ......... H03H 9/02078 331/154 |

FOREIGN PATENT DOCUMENTS

| EP | 1 748 556 A1 | 1/2007 |
| FR | 2 932 333 A1 | 12/2009 |
| FR | 2 932 334 A1 | 12/2009 |

OTHER PUBLICATIONS

Mansfeld G. D. et al.: "BAW microwave temperature sensor", Proceedings of IEEE Sensors 2004 : [ IEEE Sensors 2004 Conference]; Oct. 24-27, Vienna University of Technology, Vienna, Austria, IEEE Service Center, Piscataway, NJ, Oct. 24, 2004, pp. 876-878, XPOI0793545, ISBN: 978-0-7803-8692-1, the whole document.
International Search Report, dated Apr. 27, 2012, from corresponding PCT application.

* cited by examiner

*Primary Examiner* — Arnold Kinkead
(74) *Attorney, Agent, or Firm* — Young & Thompson

(57) ABSTRACT

This temperature sensor includes an HBAR resonator, a unit for determining the difference between two distinct resonance frequencies at a temperature T, measured between two electrodes of a same pair of the HBAR resonator and a unit for determining the temperature of the resonator from the difference in frequencies and from a one-to-one function providing the match between the temperature and the frequency difference. The resonator is formed by a stack of a first electrode, a transducer, a second electrode, and acoustic substrate and the cuts of the transducer and of the substrate are selected so as to obtain high electro-acoustic couplings and a difference in frequency temperature sensitivities between two distinct vibration modes co-existing within the resonator, greater than or equal to 1 ppm·$K^{-1}$.

15 Claims, 12 Drawing Sheets

TEMPERATURE SENSOR COMPRISING A HIGH-OVERTONE BULK ACOUSTIC RESONATOR

The present invention relates to a temperature sensor, including a resonator of the bulk wave type with high overtone modes (designated as HBAR, acronym for <<High overtone Bulk Acoustic Resonator>>).

Resonators of the high overtone bulk acoustic type HBAR are known and are for example described in the French patent applications published under the publication numbers FR 2 932 333 A and FR 2 932 334 A.

Generally, a resonator of the high-overtone bulk acoustic resonator HBAR type comprises:
- a piezoelectric transducer having a strong electro-acoustic coupling coefficient allowing effective excitation of high order overtones,
- an acoustic substrate having a high acoustic quality coefficient/excitation frequency product
- a counter-electrode formed by a metal layer adhesively bonding a first face of the transducer and a face of the acoustic substrate,
- an electrode positioned on a second face of the transducer opposite to the first face of the transducer and the substrate.

The document of G. D. Mansfeld et al., entitled <<BAW Microwave temperature Sensor>>, published in Sensors Proceeding of IEEE, October 2004, and the European patent application published under reference EP 1 748 556 A1 describe the use of a resonator of the HBAR type as a temperature sensor with reduced dimensions. In this use, the shift of the frequency of the resonator versus temperature is utilized.

The document of G. D Mansfeld et al. more particularly describes an embodiment of a temperature sensor in which the resonator is configured as a transponder. When the sensor is queried remotely by sending an electromagnetic wave as a pure sine wave, the phase of the reflected wave is measured relatively to the reference signal formed by the query signal, and the measured variations of the phase are representative of the temperature prevailing within the sensor.

The drawback of such a sensor temperature is its sensitivity to uncontrolled external coupling with the sensor. This sensitivity generates a parasitic contribution or with unknown bias to the global variation of the resonance frequency of the resonator which one does not know how to estimate and which will mar the measurement with an error.

The technical problem is to propose a temperature sensor of the high overtone bulk acoustic resonator HBAR type which, while keeping reduced dimensions, provides very accurate high resolution temperature measurements without the bias error described above.

For this purpose, the object of the invention is a temperature sensor comprising a resonator of the high overtone bulk acoustic resonator type HBAR intended to operate at a predetermined operating frequency in a range of temperatures centered around a reference temperature $T_0$, the resonator including:
- a piezoelectric transducer formed by a layer of a first thickness of a first material, cut along a first cut angle of the transducer $\phi_1$ defined by the nomenclature (YXw)/$\phi$ of the IEE Std-176 standard (revised in 1949), substantially equal to zero, and cut along a second transducer cut angle $\theta_1$ defined by the nomenclature (YXl)/$\theta$ of the IEEE Std-176 standard (revised in 1949), such that the transducer has, either a first polarization direction $\vec{P}_{Along}$ of a first longitudinal vibration mode of the transducer, and a second polarization direction $\vec{P}_{Acis\_dual}$ of a second shear vibration mode of the transducer, or a single polarization direction $\vec{P}_{Acis\_seul}$ corresponding to a shear vibration mode of the transducer, and such that the electro-acoustic coupling of a shear vibration and/or of a longitudinal vibration for the material of the transducer is greater than or equal to 5%,
- an acoustic substrate formed by a layer of a second thickness of a second material having an acoustic quality coefficient/excitation frequency product at least equal to $5.10^{12}$, cut along a first substrate cut angle $\theta_2$ defined by the nomenclature (YXl)/$\theta$ of the IEEE Std-176 standard (revised 1949), cut along a second substrate cut angle $\psi_2$ defined by the nomenclature (YXt)/$\psi$ of the IEEE Std-176 standard (revised 1949), having at least two polarization directions from among a first polarization direction $\vec{P}_{B1}$, a second polarization direction $\vec{P}_{B2}$, a third polarization direction $\vec{P}_{long}$, respectively corresponding to a shear vibration mode of the substrate with slow phase velocity, to a shear vibration mode of the substrate with fast phase velocity, and to a longitudinal vibration mode of the substrate.
- a counter-electrode formed by a metal layer adhesively bonding a first face of the transducer and a face of the acoustic substrate, and
- an upper electrode placed on a second face of the transducer opposite to the first face of the transducer and to the substrate, characterized in that
the ratio of the first thickness over the second thickness is less than or equal to 0.05;
the cut angles $\phi_1$, $\theta_1$, $\psi_2$, $\theta_2$, and the relative positioning of the transducer and of the substrate are configured in such a way
that there simultaneously exists at least two vibration modes of the substrate strongly coupled to a same extent with at least one vibration mode of the transducer, and that
said at least two strongly coupled vibrational modes of the substrate comprise a first vibration mode having a first temperature coefficient of the substrate frequency of the first order at the reference temperature $T_0$ and a second vibration mode of the substrate having a second temperature coefficient of the substrate frequency of the first order at the same reference temperature, and
the transducer, for the first vibration mode of the substrate, has a first temperature coefficient of the transducer frequency of the first order at the reference temperature, and has for the second vibration mode of the substrate, a second temperature coefficient of the transducer frequency of the first order at the reference temperature, and
the absolute value of the difference of first and second temperature coefficients of the frequency of the resonator of the first order is greater than or equal to 1 ppm/° K,
the first temperature coefficient of the frequency of the resonator of the first order being substantially equal to the sum of the first temperature coefficient of the frequency of the substrate of the first order and of the first temperature coefficient of the transducer frequency of the first order weighted by the relative thicknesses of each material relatively to the total width of the resonator, and
the second temperature coefficient of the frequency of the resonator being substantially equal to the sum of the second temperature coefficient of the frequency of the substrate of the first order and of the second temperature coefficient of the transducer frequency of the first order weighted by the relative thicknesses of each material relatively to the total thickness of the resonator.

According to particular embodiments, the temperature sensor includes one or several of the following features, taken alone or as a combination, the piezoelectric transducer is cut along a simple rotation cut $(X_1Y_1l)/\theta_1$ such that the transducer has a first polarization direction $\vec{P}_{Along}$ of a first longitudinal vibration mode of the transducer and a second polarization direction $\vec{P}_{Acis\_dual}$ of a second shear vibration mode of the transducer, and such that the electro-acoustic coupling of a shear mode wave and of a longitudinal mode wave for this material is greater than 5%, and the cut angles $\theta_1$, $\psi_2$, $\theta_2$, and the relative positioning of the transducer and of the acoustic substrate are configured so that there simultaneously exists three vibration modes of the substrate, strongly coupled to the same extent with one of the two vibration modes of the transducer, and that the three strongly coupled vibration modes of the substrate comprise a first slow shear vibration mode of the substrate, polarized along $\vec{P}_{B1}$ and having a first temperature coefficient of the substrate frequency of the first order at the reference temperature, a second fast shear vibration mode of the substrate, polarized along $\vec{P}_{B2}$ and having a second temperature coefficient of the substrate frequency of the first order at the reference temperature, and a third longitudinal vibration mode, polarized along $\vec{P}_{long}$ and having a first temperature coefficient of the substrate frequency of the first order at the reference temperature, the transducer for the first, second, third vibration modes of the substrate, respectively has first, second, third temperature coefficients of the transducer frequency of the first order at the reference temperature, the absolute value of the difference of any two temperature coefficients of the frequency of the resonator of the first order of an assembly formed with first, second, and third temperature coefficients of the frequency of the resonator of the first order, is greater than or equal to 1 ppm/° K, the first temperature coefficient of the frequency of the resonator of the first order is substantially equal to the sum of the first temperature coefficient of the frequency of the substrate of the first order and of the first temperature coefficient of the transducer frequency of the first order weighted by the relative thicknesses of each material relatively to the total thickness of the resonator, and the second temperature coefficient of the frequency of the resonator being substantially equal to the sum of the second temperature coefficient of the frequency of the substrate of the first order and of the second temperature coefficient of the transducer frequency of the first order weighted by the relative thicknesses of each material relatively to the total thickness of the resonator, and the third temperature coefficient of the frequence of the resonator being substantially equal to the sum of the third temperature coefficient of the frequency of the substrate of the first order and of the third temperature coefficient of the transducer frequency of the first order weighted by the relative thicknesses of each material relatively to the total thickness of the resonator;

the piezoelectric transducer is cut along a simple rotation cut $(X_1Y_1l)/\theta_1$ such that the transducer has a first polarization direction $\vec{P}_{Along}$ of a first longitudinal vibration mode of the transducer and a second polarization direction $\vec{P}_{Acis\_dual}$ of a second shear vibration mode of the transducer, and such that the electro-acoustic coupling of a shear mode wave and of a longitudinal mode wave for this material is greater than 5%, and the cut angles $\phi_1$, $\theta_1$, $\psi_2$, $\theta_2$, and the relative positioning of the transducer and of the substrate are configured so that there simultaneously exists only two vibration modes of the substrate strongly coupled to a same extent with one of the two vibration modes of the transducer, and that both strongly coupled vibration modes of the substrate comprise a first shear vibration mode of the substrate having a first temperature coefficient of the substrate frequency of the first order at the reference temperature, a second longitudinal vibration mode having a second temperature coefficient of the substrate frequency of the first order at the reference temperature.

The transducer for the first, second vibration modes respectively has first, second temperature coefficients of the transducer frequency of the first order at the reference temperature, the absolute value of the difference of a first and second temperature coefficients of the frequency of the resonator of the first order is greater than or equal to 1 ppm/° K, the first temperature coefficient of the frequency of the resonator of the first order being substantially equal to the sum of the first temperature coefficient of the frequency of the substrate of the first order and of the first temperature coefficient of the transducer frequency of the first order weighted by the relevant thicknesses of each material relatively to the total thickness of the resonator, and the second temperature coefficient of the resonator being substantially equal to the sum of the second temperature coefficient of the frequency of the substrate of the first order and of the second temperature coefficient of the transducer frequency of the first order weighted by the relative thicknesses of each material relatively to the total thickness of the resonator;

the material of the piezoelectric transducer is lithium niobate or lithium tantalate and the transducer is cut along a cut with simple rotation $(Y_1X_1l)/\theta_1$ wherein the cut angle $\theta_1$ is an angle comprised between 0° and 25°;

the piezoelectric transducer is cut along a cut with simple rotation $(X_1Y_1l)/\theta_1$ such that the transducer has a single polarization direction $\vec{P}_{Acis\_seul}$ corresponding to a shear vibration mode of the transducer, and such that the electro-acoustic coupling of a shear vibration and/or of a longitudinal vibration for the material of the transducer is greater than or equal to 5%, the cut angles $\theta_1$, $\psi_2$, $\theta_2$, and the relative positioning of the transducer and of the substrate are configured so that there simultaneously exists two shear vibration modes with different phase velocities, strongly coupled to a same extent with the transverse vibration mode of the transducer, and that both strongly coupled vibration modes of the substrate comprise a first slow shear vibration mode of the substrate having a first temperature coefficient of the substrate frequency of the first order at the reference temperature, a second fast shear vibration mode of the substrate having a second temperature coefficient of the substrate frequency of the first order at the reference temperature the angle formed between the single shear polarization direction of the transducer and the low phase velocity shear polarization direction of the substrate, and the angle formed between the single shear polarization direction of the transducer and the fast phase velocity shear polarization direction of the substrate are substantially equal and with a measurement equal to 45 degrees;

the transducer for the first, second vibration modes respectively has a first, second temperature coefficients of the transducer frequency of the first order at the reference temperature, the absolute value of the difference of first and second temperature coefficients of the frequency of the resonator of the first order is greater than or equal to 1 ppm/° K, the first temperature coefficient of the frequency of the resonator of the first order being substantially equal to the sum of the first temperature coefficient of the frequency of the substrate of the first order and of the first temperature coefficient of the transducer frequency of the first order weighted by the relative thicknesses of each material relatively to the total thickness of the resonator, and the second temperature coefficient of the resonator being substantially equal to the sum of the second temperature coefficient of the frequency of the substrate of the first order and of the second temperature coefficient of the frequency of the transducer of the first order weighted by the relative thicknesses of each material relatively to the total thickness of the resonator;

the material of the piezoelectric transducer is lithium niobate or lithium tantalate and the transducer is cut along a cut with simple rotation $(Y_1X_1l)/\theta_1$ wherein the cut angle $\theta_1$ is an angle comprised between 155 and 176°;

a first temperature coefficient of the frequency of the acoustic substrate is substantially zero or of opposite sign to the second temperature coefficient of this frequency of the substrate;

the cut of the substrate is such that the temperature coefficient of the frequency of the first order corresponding to at least one shear mode of the substrate is substantially zero with inversion of its sign on either side of an angle defining the cut of the substrate;

the temperature coefficient of the frequency of the first order of the substrate corresponding to at least one of the shear modes of the substrate is a local extreme with an absolute value of less than 20 ppm·K$^{-1}$ and the variation of the temperature coefficient in the vicinity of this extreme is a smooth variation, the absolute value of which is less than 2 ppm·K$^{-1}$/degree;

the material of the transducer is selected from aluminium nitride (AlN), zinc oxide (ZnO), lithium niobate (LiNbO$_3$), lithium tantalate (LiTaO$_3$), potassium niobate, PZT, PbTiO$_3$ and piezoelectric ceramics with strong electromechanical coupling, and the material of the acoustic substrate is selected from quartz, potassium niobate, lithium tantalite, gallium orthophosphate, lithium tetraborate, langasite, langatate and langanite;

the counter-electrode is a heat-compressible metal, for example gold, copper or indium and the upper electrode is for example made in aluminium;

the piezoelectric transducer is made in lithium niobate; and the material of the acoustic substrate is quartz and the acoustic substrate is cut along a section with simple rotation in which the cut angle $\phi_2$ is zero and $\theta_2$ is an angle comprised between −60 and 45 degrees;

the coupling angle $\theta_1$ of the cut $(Y_1X_1l)/\theta_1$ of the lithium niobate is selected in an interval comprised between 160 and 170°, preferably 163°, and the cut angle $\theta_2$ of the cut $(Y_2X_2l)/\theta_2$ of the acoustic substrate is selected between −48 and 35 degrees;

the cut angle $\theta_2$ of the cut $(Y_2X_2l)/\theta_2$ of the acoustic substrate is selected between −10 and 10°;

the sensor comprises a unit for determining the difference between a first resonance frequency and a second resonance frequency of the HBAR resonator at a temperature T prevailing within the resonator, measured between both electrodes of the same pair of the resonator, and a unit for determining the temperature T of the resonator from the determined difference in frequencies and from a one-to-one function providing a match between the temperature and the difference in frequencies.

The invention will be better understood according to the description of several embodiments which follow, only given as examples and made with reference to the drawings wherein.

Figure 1:
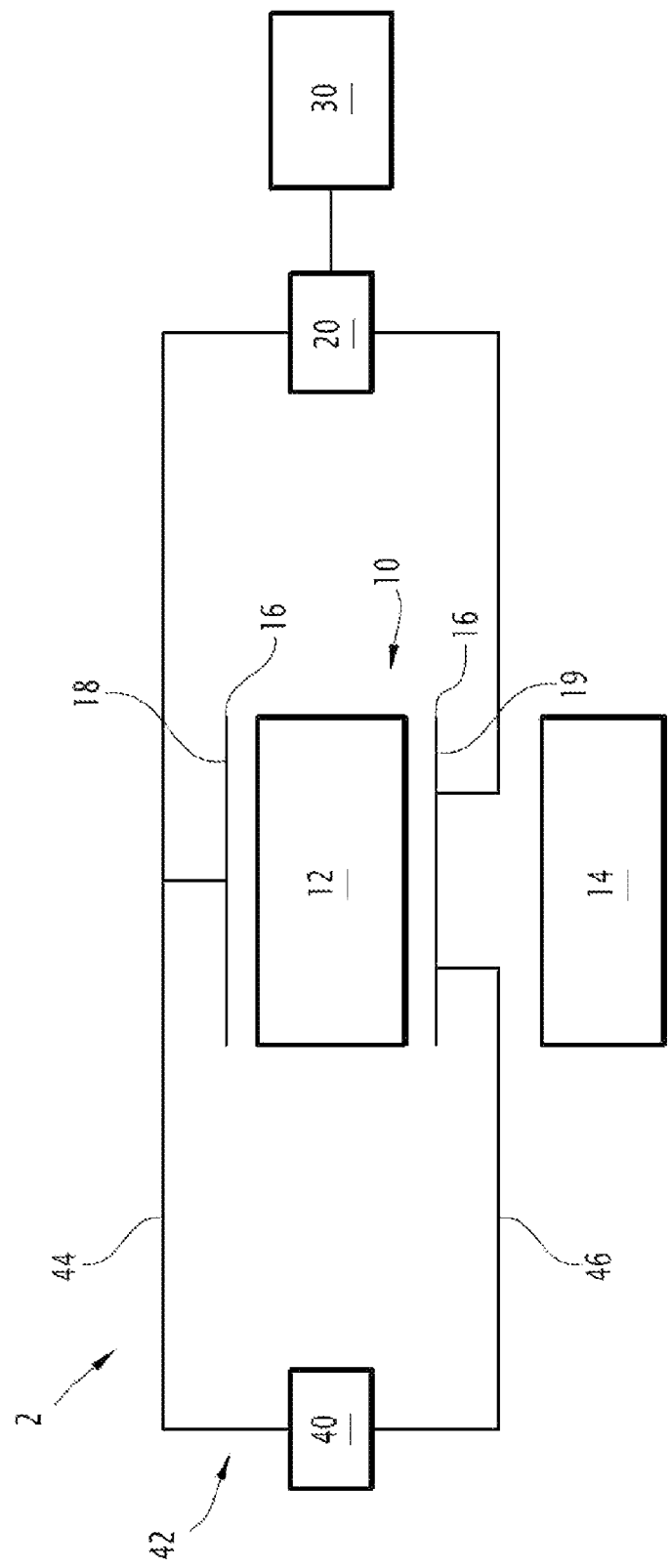
FIG. 1 is a schematic view of a temperature sensor according to the invention.

According to FIG. 1, a temperature sensor 2 according to the invention comprises:

a resonator 10 of the HBAR type with high overtone bulk waves, including a stack of an electro-acoustic transducer 12 and of an acoustic substrate 14 and a pair 16 of electrodes 18 and 19 clasping the transducer 12, a unit 20 for determining a difference in frequencies ΔF, connected at its input and in parallel with the pair 16 of electrodes, 18, 19 of the HBAR resonator 10, and a unit 30 for determining the temperature T of the resonator from the difference ΔF of frequencies determined by the unit 20 and from a one-to-one function g giving the match between the temperature T prevailing inside the resonator and the determined frequency difference ΔF, according to a relationship: ΔF=g(T).

The temperature sensor 2 also comprises an excitation source 40 of the sensor 2 coupled with the resonator 10 through the pair 16 of two electrodes 18, 19 through a connection 42, made here in FIG. 1 with two metal elements 44, 46.

The connection 42 may also be made as a wireless link through an electromagnetic field emitted by the excitation source 40.

The resonator 10 is configured according to the thickness ratios of its main constituents, formed by the transducer 12 and the acoustic substrate 14, and according to relative orientations between the crystallographic lattices of the crystals forming the transducer 12 and the acoustic substrate 14, so as to generate, when the resonator 10 is suitably excited, at least two differently and orthogonally polarized vibration modes, the resonance frequencies of which are different.

The unit 20 for determining the difference of frequencies ΔF is able to determine the difference between a first resonance frequency F1 and a second resonance frequency F2 measured between both electrodes 18, 19 of the same pair 16 of the HBAR resonator 10.

The unit 20 for determining the difference in frequencies is made for example with a frequency mixer followed by a bandpass or lowpass filter. It may also consist in detection of the peaks of the electric response of the resonator corresponding to resonances according to a principle comparable with that of a measurement by spectral analysis, the frequency shift then being numerically calculated from the thereby identified frequency values.

The unit 30 for determining the temperature is capable of determining the temperature T of the resonator 10 from the difference in frequencies determined by the unit 20 and the one-to-one function g giving the match between the temperature T and the difference in frequencies ΔF.

Several HBAR resonator structures in terms of the crystallographic cuts of the plates of the transducer 10 and of the acoustic substrate 12, and/or of the relative position of the pivoting of the plates around a same normal, and of the thickness ratio may be contemplated in order to produce the temperature sensor 2 of FIG. 1.

In order to determine such a structure, the temperature sensitivities of different vibration modes of the resonator, i.e. of the transducer 10 and of the acoustic substrate 12 in particular the longitudinal bulk, fast shear and slow shear waves in the case of an acoustic substrate formed by quartz for different crystalline orientations.

It is known that the physical properties of the resonator 10 change over time with temperature, which modifies the electro-acoustic behavior of the resonator 10, and causes a shift of the synchronism frequency of the resonator. By studying these physical properties versus temperature, for example according to the approach known as that of Campbell and Jones, it is possible to determine a law relating the resonance frequency of a vibration mode of the resonator 10 to the temperature. This law applies temperature coefficients of the frequency, which in particular depend on the cut angles and on the thicknesses of the transducer 10 and of the substrate 12.

The so-called Campbell and Jones approach is described in the article of J. J. Campbell, W. R. Jones, <<A method for estimating crystals cuts and propagation direction for excitation of piezoelectric surface waves>>, IEEE Transactions on Sonics and Ultrasonics, Vol. 15, pp. 209-217, 1968.

By selecting the cut angles and the thicknesses of the transducer 10 and of the substrate 12 so that the difference in the temperature coefficients of the first order of the resonator 10 of two vibration modes sufficiently coupled by the transducer 10 has a value greater than or equal to 1 ppm/° K, it is then possible to establish a relationship between the temperature and the difference of the resonance frequencies, rejecting the noise sources and the parasitics. This effect defines the sensitivity of the temperature sensor 2 and an accurate temperature sensor of small dimensions is thereby achieved.

Preferably, the cut angles and the thicknesses of the transducer 10 and of the substrate 12 are selected so that the difference in the temperature coefficients of the first order of the resonator 10 of two vibration modes sufficiently coupled by the transducer 10 has a value greater than or equal to 3 ppm/° K, when this sensitivity may be attained over the temperature range which one attempts to measure and is compatible with the frequency band allowed by the radio frequency standards.

Indeed, by knowing the resonance frequencies of the first and second vibration modes at a reference temperature $T_0$, and by knowing the law relating the resonance frequency to the temperature, it is possible to infer the ambient temperature T prevailing within the resonator 10 by measuring and comparing the resonance frequencies of these first and second vibration modes at this ambient temperature T.

The expression of the first resonance frequency $F_1(T)$ at temperature T of a first resonance mode is written in the most general form:

$$F_1(T)=F_{1,0}(T_0)[1+\theta_{\alpha 1}(T-T_0)+\theta_{\alpha 2}(T-T_0)^2+\theta_{\alpha 3}(T-T_0)^3]$$

wherein:

$T_0$ is the reference temperature often defined at 25° C.; $F_{1,0}(T_0)$ is a constant representative of the frequency of the first order at the reference temperature; $\theta_{\alpha 1}$, $\theta_{\alpha 2}$, $\theta_{\alpha 3}$ are respectively the temperature coefficients of the first, second, third orders of the frequency of the first resonance mode of the resonator 10.

The expression of the second resonance frequency $F_2(T)$ at temperature T of a second resonance mode coupled with the transducer to a same extent as the first mode, is written in the most general form:

$$F_2(T)=F_{2,0}(T_0)[1+\theta_{\beta 1}(T-T_0)+\theta_{\beta 2}(T-T_0)^2+\theta_{\beta 3}(T-T_0)^3]$$

wherein:

$T_0$ is the reference temperature; $F_{2,0}(T_o)$ is a constant representative of the frequency of the second mode at the reference temperature; $\theta_{\beta 1}$, $\theta_{\beta 2}$, $\theta_{\beta 3}$ are respectively the temperature coefficients of the first, second, third orders of the frequency of the second resonance mode of the resonator 10.

The expression of the difference in frequencies is therefore written in the most general form:

$$\Delta F(T)=\Delta F_0(T_0)[1+\Delta\theta_1(T-T_0)+\Delta\theta_2(T-T_0)^2+\Delta\theta_3(T-T_0)^3]$$

wherein the constants $\Delta F_0(T_0)$, $\Delta\theta_1$, $\Delta\theta_2$, $\Delta\theta_3$ are calculated from constants, $F_{1,0}(T_0)$, $\theta_{\alpha 1}$, $\theta_{\alpha 2}$, $\theta_{\alpha 3}$, $F_{2,0}(T_0)$, $\theta_{\beta 1}$, $\theta_{\beta 2}$, $\theta_{\beta 3}$.

It will be noted that the temperature coefficients of the frequency of the first and second modes are preferably as far as possible from each other, so that even small temperature variations have a perceivable influence on the variation of the difference between the resonance frequencies of these first and second modes. Thus, a particularly accurate temperature sensor is obtained.

Further, a resonator of the high overtone bulk wave HBAR type has small dimensions, its volume being generally less than one cubic millimeter.

Figure 2:
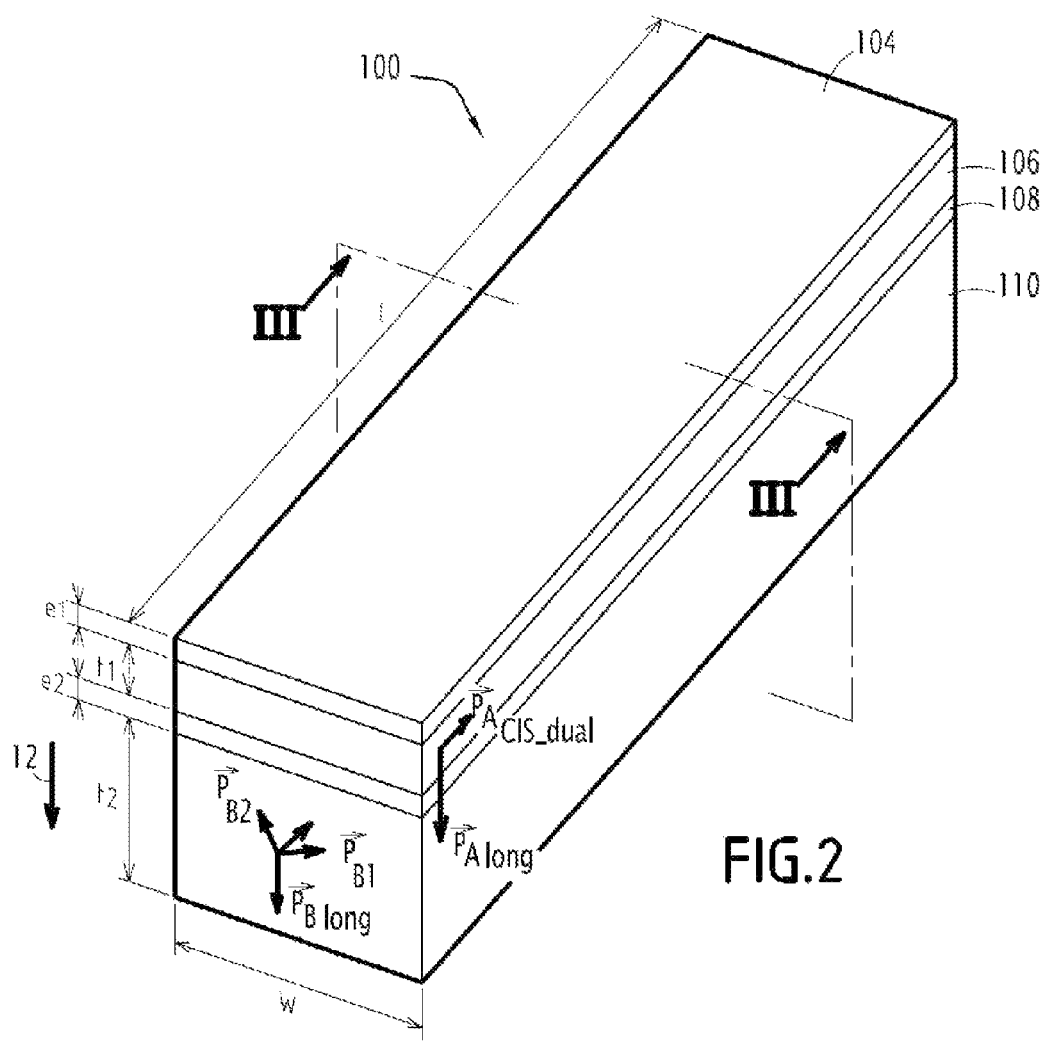
FIG. 2 is a perspective view of a first embodiment of an HBAR resonator of the temperature sensor of FIG. 1.
Figure 3:
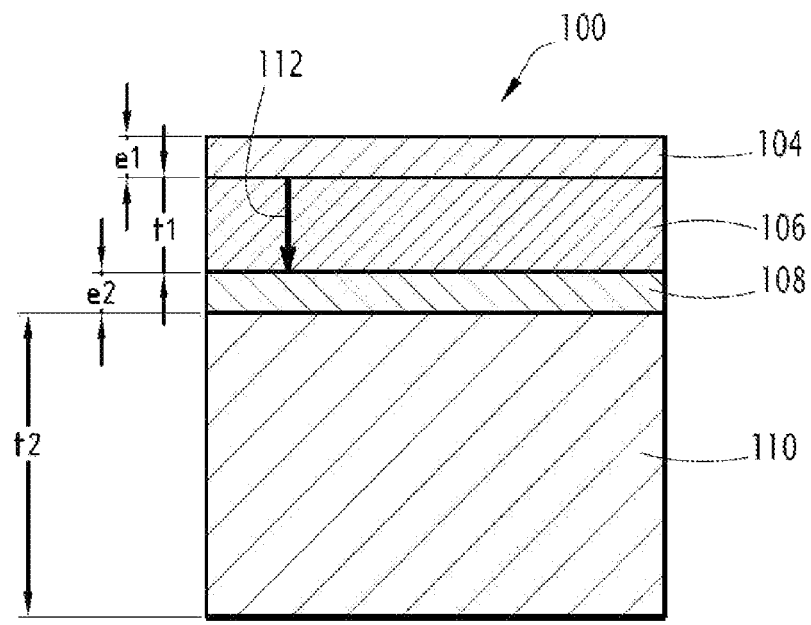
FIG. 3 is a view of a transverse section of the resonator of FIG. 2 along the line III-Ill.

According to FIGS. 2 and 3, a first embodiment 100 of the resonator 10 of the high overtone bulk wave HBAR type of the temperature sensor 2 of FIG. 1 comprises a stack of successive layers including:

an upper electrode 104, forming the electrode 18 of the resonator 10 of FIG. 1, in aluminium and of thickness $e_1$, a piezoelectric transducer 106 consisting of a first material, here lithium niobate ($LiNbO_3$), in a single-crystal form having a first thickness $t_1$, a buried counter-electrode 108 in gold, of thickness $e_2$, forming the electrode of FIG. 1, an acoustic substrate 110 consisting of a second material, here single-crystal quartz having a second thickness $t_2$.

All the layers 104, 106, 108 and 110 have in FIG. 2 the same length L and the same width W, the length L and the width W being clearly greater than the different layer thicknesses $e_1$, $t_1$ and $e_2$.

The ratio of the first thickness $t_1$ over the second thickness $t_2$ is preferably less than or equal to 0.05.

In order to simplify FIG. 2, the electrodes 104, 108 are illustrated with surface areas equal to those of the piezoelectric transducer 106.

In practice, the electrodes 104, 108 have surface areas smaller than those of the piezoelectric layer 106, and the upper electrode 104 has a surface area less than or equal to that of the buried counter-electrode 108.

In the manufacturing process including a buried layer used as an adhesion layer, the counter-electrode 108 naturally has a surface area greater than that of the upper electrode 104 made by a lithographic technique and a technique for depositing a metal layer.

The surfaces of the electrodes 104, 108 are positioned facing each other, parallel with each other, the respective areas facing the surfaces being maximum, with edges as parallel as possible. In the ideal case, the surfaces of the electrodes 104, 108 are perfectly superposed.

Thus, the excitation of the waves is assumed to correspond to a so-called plane-plane resonator configuration, for which the waves are excited by the very thin electrodes 104, 108 deposited on the surfaces facing the piezoelectric transducer 106. The acoustic bulk waves will be able to be established over a number of wavelengths proportional to the order of the harmonic (1 for 2) within the resonant area, the propagation direction of the acoustic waves being illustrated by the arrow 112.

The piezoelectric transducer 106 is configured so as to have two polarization modes of the vibrations, a first longitudinal mode for which the crystal deforms in a same direction $\vec{P}_{Along}$ as the one 112 for the propagation of the acoustic wave, and a second shear or transverse vibration mode, the polarization vector of which $\vec{P}_{Acis\_dual}$ has a direction orthogonal to that of the polarization vector of the longitudinal mode vibration.

For simple rotation cuts of lithium niobate and of lithium tantalate, the second shear vibration mode is a fast shear mode.

The acoustic substrate 110 is configured so as to exhibit three differently polarized vibration modes, a first longitudinally polarized vibration mode illustrated by a first polarization vector $\vec{P}_{Blong}$ with a direction parallel to the propagation direction 112, a second transversely polarized vibration mode with a slow phase velocity illustrated by a second polarization vector $\vec{P}_{B1}$ with a direction orthogonal to the propagation direction 112, and a third transversely polarized vibration mode with a fast phase velocity illustrated by a third polarization vector $\vec{P}_{B2}$ with a direction orthogonal to the propagation direction 112 and to the direction of the second polarization vector $\vec{P}_{B1}$.

The transverse or shear vibration modes define shear waves with slow phase velocity and shear waves with fast phase velocity which propagate inside the acoustic substrate 110 along the propagation direction 112, the so-called fast waves having a greater phase velocity than that of so-called slow waves.

The counter-electrode 108 interposed between the transducer 106 and the acoustic substrate 110 is further used as an adhesive bond to the structure of the resonator 2.

The lithium niobate ($LiNbO_3$) layer, forming the transducer 106 is a plate cut out in a raw single-crystal material forming a wafer. The plate is here cut out according to a cut with simple rotation designated by $(Y_1X_1lt)/\theta_1$ in the IEEE Std-176 standard (revised in 1949) wherein $\theta_1$ refers to a cut angle.

The quartz layer forming the acoustic substrate 110 is a plate cut out in a raw single-crystal material forming a wafer. The plate is cut out here along a section with double rotation designated by $(Y_2X_2lt)/\theta_2/\psi_2$ in the IEEE Std-176 standard (revised in 1949) wherein $\theta_2$ refers to a first cut angle and $\psi_2$ to a second cut angle.

The definition of the cut angles according to the IEEE Std-176 standard (revised in 1949) is recalled here and for the following. The axes noted $X_i$, $Y_i$ and $Z_i$, with i being an index varying from 1 to 2, designate the crystallographic axes of a crystal, i being equal to 1 when the crystal is a transducer of the resonator and i being equal to 2 when the crystal is an acoustic substrate of the resonator. A cut plate is noted as $(Y_i X_i)$ when the normal to this cut plate is the $Y_i$ axis and when the propagation direction is the $X_i$ axis. The $w_i$ (along the width of the cut plate), $l_i$ (along its length, therefore the propagation direction), and $t_i$ (perpendicular to the cutting plate), directions are also defined here with the same convention for i.

A cut angle is defined starting with the cut plate (YX) and by applying three successive rotations. The rotation around $w_i$ is noted as $\phi_i$, the rotation around $l_i$ is noted as $\theta_i$, and the rotation around $t_i$ is noted as $\psi_i$.

Figure 4:
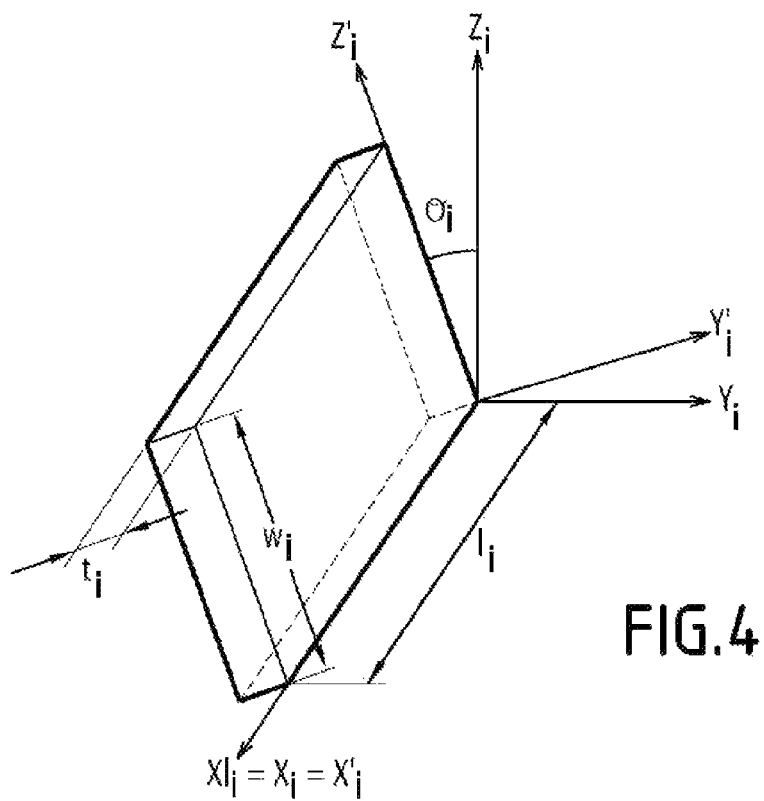
FIG. 4 is a view of a section with a simple rotation noted as $(Y_iX_il_i)/\theta_i$ according to the IEE Std-176 standard on the piezoelectricity of a crystal designated by the index i.

A section with a simple rotation, designated by $(Y_i X_i l_i)/\theta_i$ and illustrated in FIG. 4, is obtained by starting with the cut plate $(Y_i X_i)$ and applying the single rotation around the axes $l_i$ according to the angle $\theta_i$.

Figure 5:
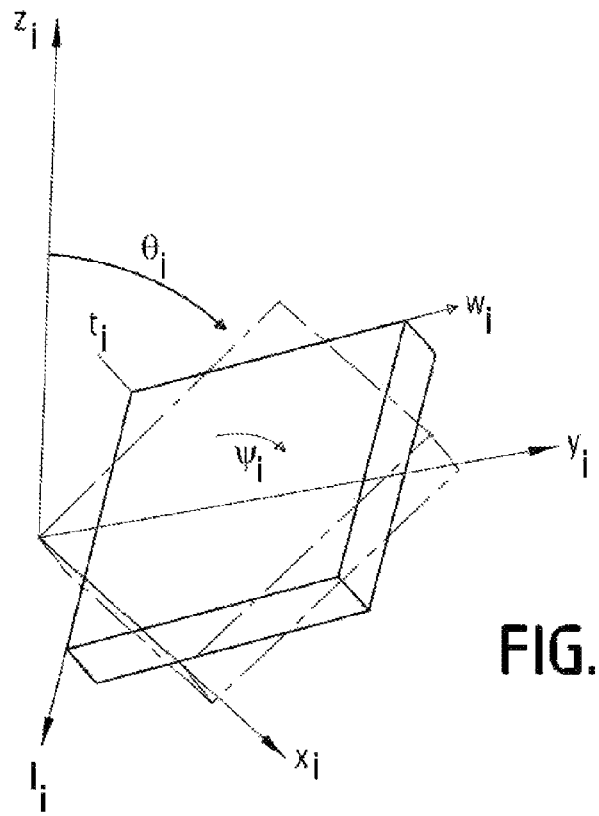
FIG. 5 is a view of a section with double rotation noted as $(Y_iX_il_it_i)/\theta_i/\psi_i$ of a crystal designated by the index i.

A section with a double rotation, designated as $(Y_i X_i lt)/\theta_i/\psi_i$ and illustrated in FIG. 5, is obtained by starting with the cut plate $(Y_i X_i)$ and successively applying a first rotation of angle $\theta_i$ around $l_i$ and a rotation of angle $\psi_i$ around $t_i$.

Figure 6:
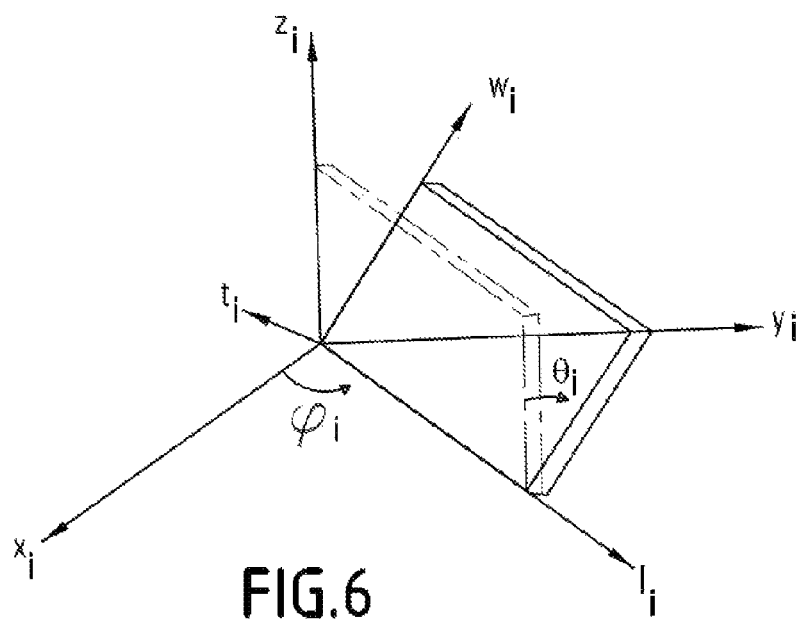
FIG. 6 is a view of a section with double rotation $(Y_iX_iw_il_i)/\phi_i/\theta_i$ of a crystal designated by index i.

A cut with double rotation, designated as $(Y_i X_i wt)/\phi_i/\theta_i$ and illustrated in FIG. 6, is obtained by starting with the cut plate $(Y_i X_i)$ and successively applying a first rotation of angle $\phi_i$ around $w_i$ and a rotation of angle $\theta_i$ around $l_i$.

Figure 7:
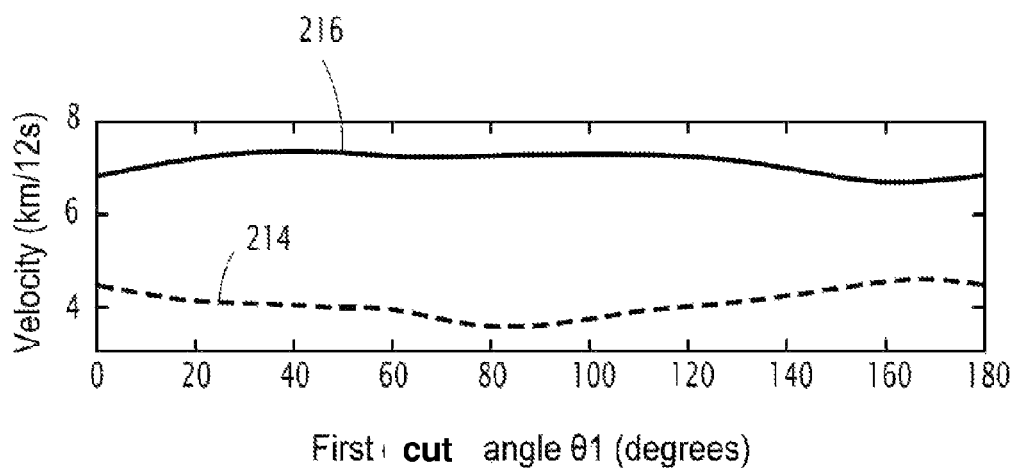
FIG. 7 is a view of the time-dependent change in the phase velocity of bulk waves of a lithium niobate crystal versus a cut angle $\theta_1$ for the family of crystalline orientations noted as $Y_1X_1l/\theta_1$.

FIG. 7 illustrates the time-dependent change of the phase velocity of the shear and longitudinal waves for cuts with simple rotation around the crystallographic axis $Xl_1$ of the transducer 106 for lithium niobate.

The curve 214 represents the phase velocity of the shear waves propagating in the transducer 106 along the axis normal to the planes of the electrodes 104 and 108 versus the cut angle $\theta_1$.

The curve 216 represents the phase velocity of the longitudinal waves, expressed in km/s, propagating in the transducer 106 along the axis of the length $l_1$ versus the first cut angle $\theta_1$, expressed in degrees.

Figure 8:
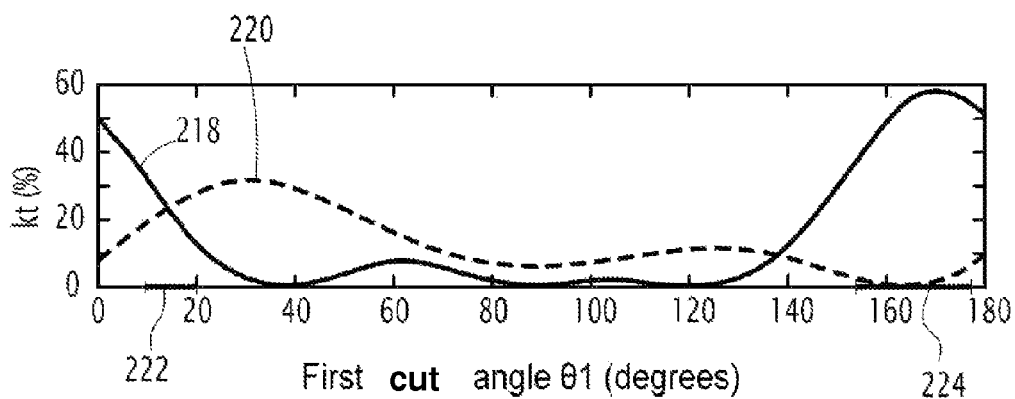
FIG. 8 is a view of the time-dependent change of the coupling coefficients of the same waves as those of FIG. 7 for lithium niobate versus the cut angle $\theta_1$.

FIG. 8 illustrates the coupling of the longitudinal and shear waves for cuts with a simple rotation around the crystallographic axis $Xl_1$ of the transducer 106.

The curve 218 represents the time-dependent change of the coupling coefficient $K_T$ expressed as a percentage of the electric energy converted into acoustic energy for shear waves versus the first cut angle $\theta_1$ expressed in degrees.

The curve 220 represents the time-dependent change of the coupling coefficient $K_T$ expressed as a percentage of the electric energy converted into acoustic energy for longitudinal waves versus the first cut angle $\theta_1$ expressed in degrees.

In FIG. 8, the curves 218, 220 have a first angular area 222 centered around the value 15° and comprised between 10° and 20° in which the longitudinal wave and the shear wave are each coupled by piezoelectricity and each contribute to a same extent to the electric response of the transducer 10, and the excitation both of the longitudinal wave and of the shear wave is particularly effective for electromechanical coupling comprised between 15% and 25%.

In FIG. 8, the curves 218, 220 have second angular area 223 centered around the value 5° and comprised between 0° and 15° in which the shear mode has a coupling which is twice that of the longitudinal mode. The coupling of the shear mode is of the order of 20 to 30% and that of the longitudinal mode of 5 to 15%. In this case, twice more coupling is obtained on the shear mode than on the longitudinal mode, which gives the possibility of exciting to a same electromechanical coupling level, three waves in the substrate, i.e. the two shear waves and the longitudinal wave. This configuration is important for a remote querying application where it will be sought to obtain well-balanced contributions of each mode for reasons of minimization of the sensitivity of the frequency shifts between modes, to the electromagnetic environment.

In FIG. 8, the curves 218 and 220 have a third area 224, centered around the value of 163° and comprised between 158° and 168°, wherein the longitudinal wave is quasi not coupled by piezoelectricity and therefore does not contribute to the electric response of the transducer 206 and the excitation of the shear wave is particularly effective with an electromechanical coupling comprised between 50 and 60%.

The cut angle $\theta_1$ of the lithium niobate plate forming the transducer 106 of FIG. 2, is preferably selected in the first area 222 comprised between 10° and 20°.

In practice, a value of a cut angle $\theta_1$ such that the electro-acoustic couplings of a shear vibration and of a longitudinal vibration for the material of the transducer are equal to or greater than 5% is suitable and may thus be selected from between 0° and 23°. The same angular values may be applied for lithium tantalate which is an also advantageous material to be used for the transducer.

For such a selected value of the cut angle $\theta_1$, the transducer 106 is capable of generating two vibration modes: a longitudinal vibration mode and a transverse vibration mode or with a shear wave.

The cut of the quartz plate forming the acoustic substrate 110 of FIG. 2 is a crystallographic cut of the $(Y_2 X_2 lt)/\theta_2/\psi_2$ type in which the cut angle $\theta_2$ is selected in an interval centered around 35° and with an amplitude equal to 10°, and in which the cut angle $\psi_2$ is selected in intervals selected around 45° and with an amplitude of 10°. In this way by projection, the excited shear wave in the transducer may be distributed among both shear modes of the substrate with identical efficiency.

Figure 9:
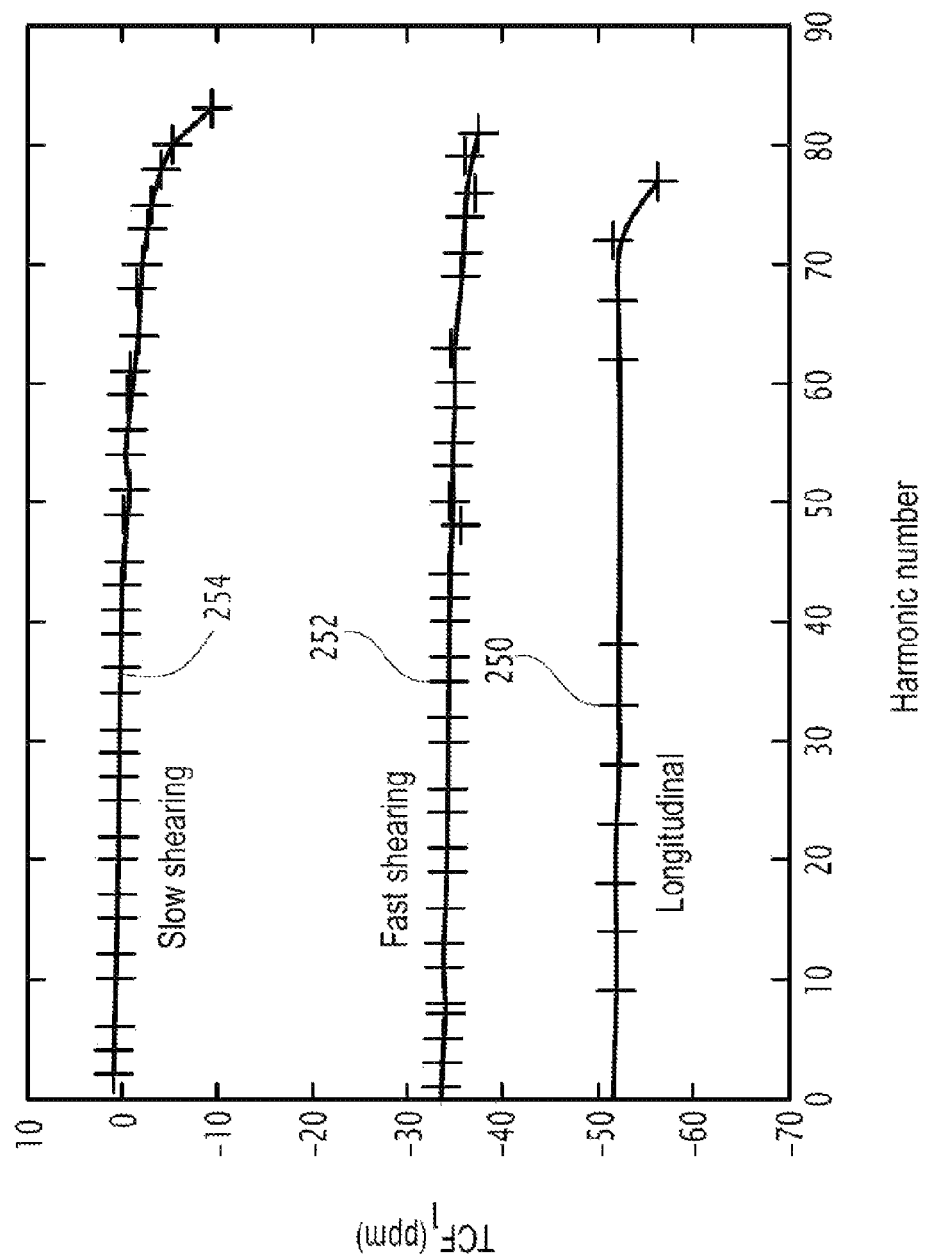
FIG. 9 is a view of the time-dependent change of the temperature coefficient of a resonator of FIG. 1 for a stack of a lithium niobate plate with a section $(Y_1X_1l)/15°$ and of a quartz plate with a cut $(Y_2X_2lt)/35°/45°$ for a thickness ratio of 1 μm of lithium niobate over 50 μm of quartz.

FIG. 9 shows the time-dependent change in the frequency temperature coefficients of the first order TCF1 of the longitudinal mode, of the slow and fast phase velocity shear modes versus the harmonic rank of the vibrations for the particular configuration of a stack without pivoting of the plates between them, of a cutting lithium niobate plate (YXl)/15° and of a quartz plate (Y2X2lt)35°/45° and a thickness ratio of 1 μm of niobate over 50 μm of quartz.

A curve 250, respectively curves 252, 254, illustrate the time-dependent change of the TCF1 for the longitudinal vibration mode, respectively for the fast shear transverse vibration mode and for the slow shear transverse vibration mode.

It is recalled that the value of 15° for the cut angle of the lithium niobate plate was selected in order to obtain comparable coupling to the same extent of the longitudinal and shear modes.

It should be noted that since the shear mode will be used for also exciting the slow and fast modes in quartz, it is legitimate to reduce this angle $\theta_1$ towards about 10° and to benefit from a stronger coupling of the shear mode than that of the longitudinal mode, for the sake of balancing the modal contributions to the electric response of the resonator.

Thus three cases may be distinguished: a first case when it is sought to excite with equal effectiveness two shear modes alone, a second case when it is sought to excite with equal effectiveness a shear mode and a longitudinal mode, and a third case when it is sought to excite with equal effectiveness the three possible modes.

The optimum configurations corresponding to these three cases are respectively a stack of a lithium niobate plate with a cut $(Y_1X_1)/163°$ and of a quartz plate $(Y_2X_2lt)/35°/45°$, a stack of a lithium niobate plate with a cut $(Y_1X_1)/15°$ and of a quartz plate $(Y_2X_2lt)/35°/90°$ and a stack of a lithium niobate plate with a cut $(Y_1X_1)/15°$ and of a quartz plate $(Y_2X_2lt)/35°/45°$.

The selection of the value of 35° for the angle $\theta_2$ advantageously gives the possibility of having a mode which is stable in temperature which may be used as a reference in frequency. Here this is the slow phase velocity shear mode.

This frequency reference advantageously gives the possibility of reducing the excursion range of the resonance modes for producing the differential temperature sensor and being compatible with bands allotted by the regulations. This is for example true for the industrial, scientific, medical bands designated as ISM bands having a bandwidth equal to 1.7 MHz for the one centered on 434 MHz.

The selection of the value of $\psi_2$ around 45° allows coupling to a same extent of the slow and fast shear modes and therefore the effective use of both shear modes for a temperature sensor. This configuration is important for a remote query application when it is specifically sought to obtain well-balanced contributions of each mode for reasons of minimization of the sensitivity of the frequency shifts between modes to the electromagnetic environment.

It should be noted that it is equivalent to cut the quartz plate according to a cut with simple rotation $(Y_2X_2l)\theta_2$ with $\theta_2$ equal to 35° or to pivot the quartz plate around the normal of the lithium niobate plate so that the polarization shear vector of the lithium niobate plate $\vec{P}_{Acis\_dual}$ forms with the slow phase velocity and fast phase velocity shear polarization vectors $\vec{P}_{B2}$ and $\vec{P}_{B3}$ of quartz, measurement angles substantially equal to 45 degrees.

Alternatively, the $\theta_2$ is comprised between −60° and 45°. This wide cut angle range not only encompasses the cases in which positive TCFBs (TCFB1) and negative TCFBs (TCFB2) are found for the respectively slow and fast shear modes, also in the case when it is possible to excite at least one mode which is stable in temperature in the sense of minimization of the temperature coefficient of the frequency of the resonator (TCF1). This range also covers the operating point for which both shear modes of the substrate have the same frequency temperature coefficient. This operating point is a low limit for which the frequency temperature coefficient difference of the resonator between both shear modes is equal to 1 ppm/$K^{-1}$. Thus, over this angular range of cuts with simple rotation of the substrate, TCF differences of the resonator comprised between 1 ppm/$K^{-1}$ and 180 ppm/$K^{-1}$ may be utilized.

Alternatively, the angle $\psi_2$ in the case of a crystallographic cut $(Y_2X_2lt)/\theta_2/\psi_2$ and of an alignment without pivoting of the quartz plate relatively to the lithium niobate plate, or equivalently the pivot angle of the quartz plate when the quartz plate is cut along the cut with simple rotation $(Y_2X_2l)/\theta_2$, is arbitrary. In this case, the longitudinal mode and at least one shear mode may be used for providing the information of a differential temperature sensor.

One method used for determining the interesting quartz cuts suitable for obtaining a temperature sensor is the following.

This method is a simplified method in the sense that it assumes that the contribution of the differential effects of sensitivities in frequency temperature of the transducer for at least two resonance modes, when the cuts of the transducer correspond to high electro-acoustic couplings to the same extent for said at least two resonance modes, is negligible relatively to the differential effects of temperature sensitivities of the frequencies of the acoustic substrate for the same resonance modes.

The temperature sensitivities of the longitudinal, fast and slow shear bulk waves are first determined for all the crystalline orientations of the quartz in $\theta_2$, $\phi 2$ and $\psi_2$.

Figure 10:
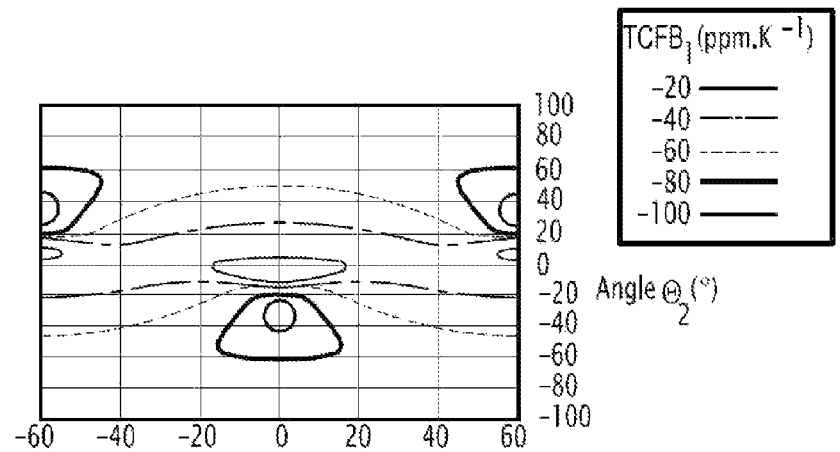
FIG. 10 is a graphic view with level curves of the time-dependent change of the frequency temperature coefficient of the first order TCFB1 of the longitudinal polarization mode in the quartz versus the first cut angle $\phi_2$ and the second cut angle $\theta_2$ for the family of crystalline orientations $Y_2X_2lt$.
Figure 11:
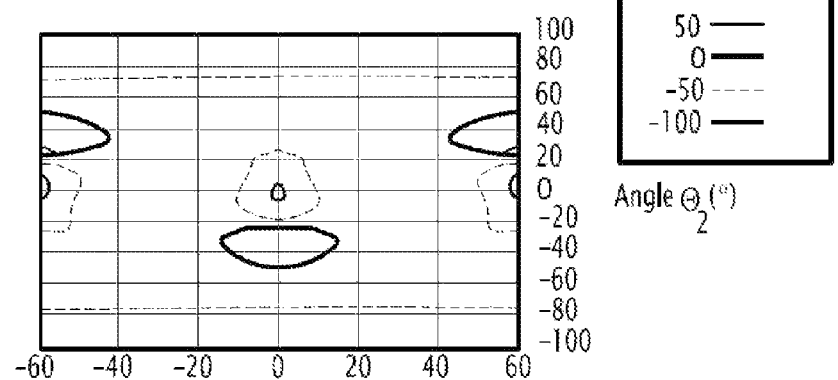
FIG. 11 is a graphic view with level curves of the time-dependent change of the frequency temperature coefficient of the first order TCFB1 of the polarization mode of a shear wave with fast phase velocity in quartz versus the first cut angle $\phi_2$ and the second cut angle $\theta_2$ for the family of crystalline orientations $Y_2X_2lt$.
Figure 12:
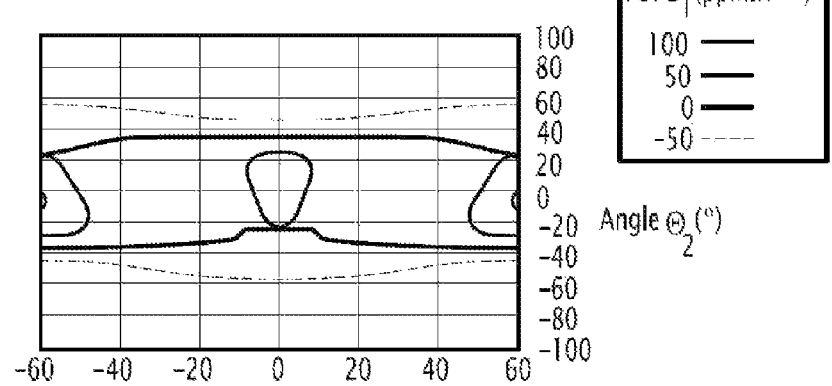
FIG. 12 is a graphic view with level curves of the time-dependent change of the frequency temperature coefficient of the first order TCFB1 of the polarization mode of a shear wave with slow phase velocity in quartz versus the first cut angle $\phi_2$ and the second cut angle $\theta_2$ for the family of crystalline orientations $Y_2X_2lt$.

As an example, FIGS. 10, 11, 12 respectively illustrate the frequency temperature sensitivities of the first order TCFB1 of longitudinal, fast and slow shear bulk waves in quartz, for all the crystalline orientations in $\theta_2$ and $\psi_2$, the angle $\psi_2$ in these graphs of level curves being equal to zero.

It should be noted that the differential sensitivities of the first order are representative of the detection sensitivity of the temperature sensor in a first approximation, the sensitivities of greater order being then considered (and more particularly those of order 2) for refining the estimation of the effective temperature of the sensor.

As this is visible in FIG. 10, the longitudinal waves always have a negative sensitivity coefficient to the temperature of the first order TCFB1, regardless of the cut angle.

On the other hand, it is visible in FIGS. 11 and 12 that there exist cut angles $\theta_2$ and $\psi_2$ for which the temperature sensitivity coefficient of the first order TCFB1 of the slow shear mode or of the fast shear mode, cancels out by changing sign.

It is therefore in particular possible to determine many cut angles $\theta_2$ and $\psi_2$ for which both modes have thermal drifts of the TCF frequency with opposite signs.

These exhaustive values of TCFB1 sensitivities depending on the cut angles are required for identifying particularly attractive domains or areas of crystalline cuts for seeking HBAR structures for allowing the development of a differential temperature sensor having sufficient sensitivity.

The existence of symmetries according to the angle $\phi_2$ is noted in quartz, which symmetries are expressed by the following relationships:

$$TCFB_1(\phi_2,\theta_2)=TCFB_1(\phi_2+120,\theta_2)$$

and $$TCFB_1(\phi_2,\theta_2)=TCFB_1(-\phi_2,\theta_2).$$

The longitudinal waves always have a negative TCFB1, while the shear modes have angular areas for which the temperature sensitivity coefficient of the first order cancels out and therefore changes sign.

The vicinity of these crystalline orientations is all the more interesting since the mode non-coupled by piezoelectricity will inevitably have a thermal drift of the frequency with a sign opposite to that of the coupled mode in proximity to this angular locus. Many angular areas substantially exist for which two modes may exist which have thermal drifts of the frequency of opposite sign and therefore a frequency temperature sensitivity difference greater than or equal to 20 ppm·$K^{-1}$.

In fact, the coupling of two shear modes or of a longitudinal mode and a shear mode may be contemplated, the essential point being duly calibrating the differential thermal sensitivity in order to obtain a temperature sensor having the desired performance.

This operation therefore requires the establishment of a minimum of abacuses for determining the thermal drift resulting from the difference between the resonance frequencies respectively associated with the utilized modes.

It should be noted that examination of the abacuses of the TCFB1s of quartz is sufficient when the cut angle $\theta_1$ of the lithium niobate is comprised in the first area 222 or in the area 224.

Figure 13:
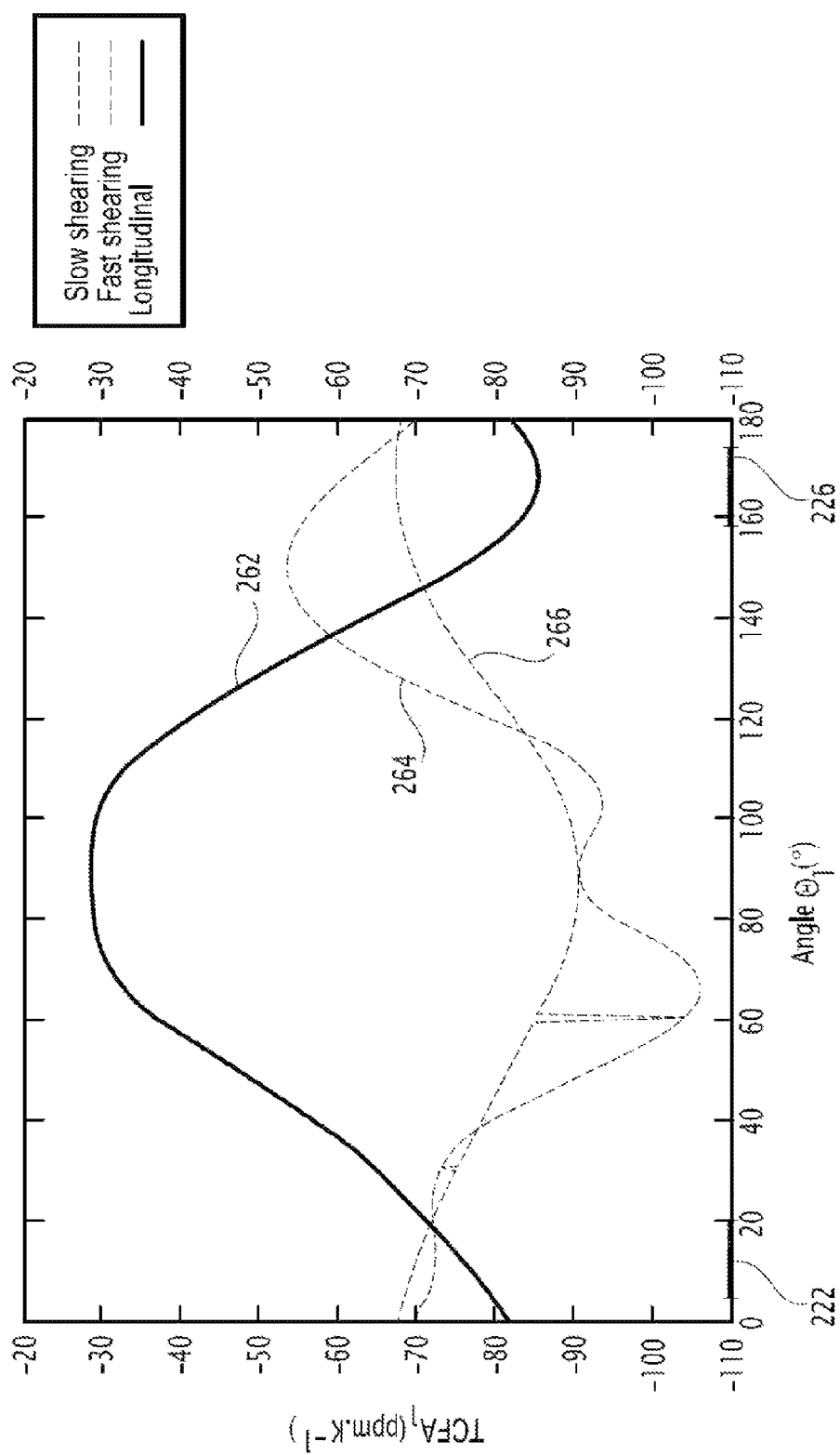
FIG. 13 is a view of the time-dependent change of the frequency temperature coefficients of the first longitudinal vibration mode, of the shear mode with slow phase velocity, of the shear mode with fast phase velocity inside a lithium niobate crystal with a cut with simple rotation $Y_1X_1l$ versus the cut angle $\theta_1$.

Indeed, according to FIG. 13 which illustrates curves 262, 264, 256 of the respective time-dependent change in the frequency temperature sensitivity of the longitudinal mode, of the fast shear mode and of the slow shear mode, it is visible that the difference of the TCFA1s of lithium niobate for two different modes is less than about 15 ppm·K$^{-1}$.

Strictly speaking, the calculations of the laws for the variation of the resonance frequencies for different vibration modes versus temperature depend on the TCF1s of the resonator, i.e. on the cumulated effect for a given mode of the TCFB1 of the acoustic substrate, here of quartz and of the TCFA1 of the transducer, here lithium niobate.

Thus, for a pair of materials selected for the transducer 10 and the acoustic substrate 12, abacuses of the TCFs of the transducer 10 and of the acoustic substrate 12 should be available and pairs of transducer/acoustic substrate crystallographic orientations should be selected, such that the cumulated TCF difference of the first order, associated with the assembly formed by the transducer and the substrate, between a first vibration mode and a second vibration mode, is greater than or equal to 1 ppm·K$^{-1}$.

In a first approximation, the first temperature coefficient of the frequency of the resonator 10 of the first order TCF1, associated with the first vibration mode, is equal to the sum of the first temperature coefficient of the frequency of the substrate 14 of the first order TCFB1 and of the first temperature coefficient of the transducer frequency 12 of the first order TCFA1 weighted by the relative thicknesses of each material relatively to the total thickness of the resonator. This approximation is expressed by the equation:

$$TCF1=(TCFA1*t_1+TCFB1t_2)/(t_1+t_2).$$

In a first approximation, the second temperature coefficient of the resonator 10 of the first order TCF1, associated with the second vibration mode, is equal to the sum of the second temperature coefficient of the frequency of the substrate 14 of the first order TCFB2 and of the second temperature coefficients of the transducer frequency 12 of the first order TCFA2 weighted by the relative thicknesses of each material relatively to the total thickness of the resonator. This approximation is expressed by the equation:

$$TCF2=(TCFA2*t_1+TCFB2*t_2)/(t_1+t_2).$$

These approximations are valid when the ratio of the first thickness $t_1$ over the second thickness $t_2$ is less than or equal to 0.05.

Figure 14:
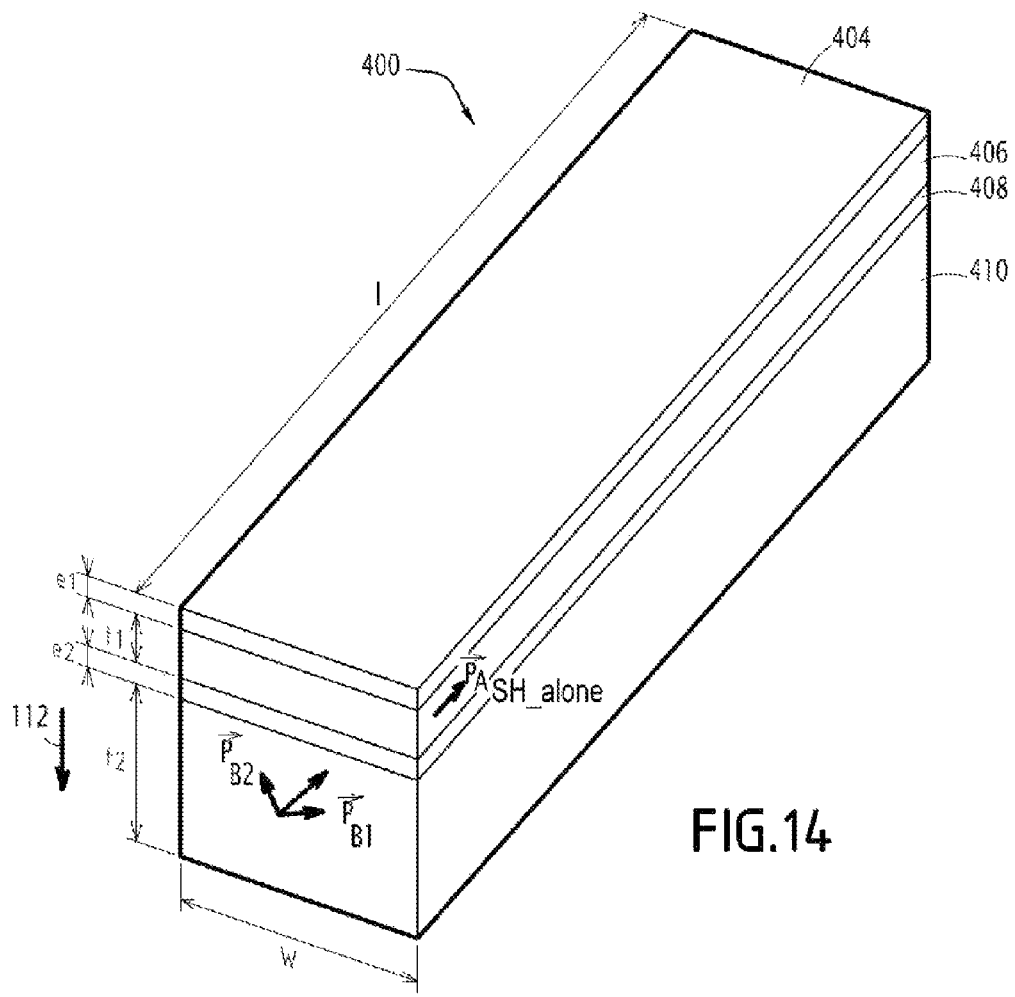
FIG. 14 is a perspective view of a second embodiment of a temperature sensor of FIG. 1, wherein the cut angle of the niobate is selected for electro-acoustic coupling of the shear modes alone.

According to FIG. 14, a second embodiment 400 of a resonator 10 of the high overtone bulk wave HBAR type of the temperature sensor of FIG. 1, comprises a stack of successive layers, identical in terms of materials and layer thicknesses $e_1$, $e_2$, $t_1$, $t_2$ used with those described in FIGS. 2 and 3, but different as regards the crystallographic orientations of the transducer 12 and of the acoustic substrate 14 respectively designated here with references 406 and 410.

The piezoelectric transducer 406 is here configured so as to have a single polarization mode $\vec{P}_{Acis\_seul}$ corresponding to a shear vibration mode of the transducer 406 and such that the electro-acoustic coupling coefficient $K_T^2$ of the shear wave is greater than or equal to 5%.

In this lithium niobate cut configuration, the longitudinal vibration mode is inexistent or at the very least negligible relatively to the transverse vibration mode.

Preferably, the lithium niobate cut is a cut with simple rotation $(Y_1X_1l)/\theta_1$ in which the cut angle $\theta_1$ is comprised in the second area 224 described in FIG. 7, i.e. comprised between 158° and 168°.

Preferably, the cut angle $\theta_1$ is comprised between 163 and 165°. In this case, only the fast shear waves are coupled in the lithium niobate.

The acoustic substrate 410 is configured in order to have two transverse or shear polarization modes, a first transversely polarized vibration mode with a slow phase velocity, illustrated by a first polarization vector $\vec{P}_{B1}$ with a direction orthogonal to the polarization direction 112, and a second transversely polarized vibration mode with fast phase velocity illustrated by a second polarization vector $\vec{P}_{B2}$ orthogonal to the first polarization vector $\vec{P}_{B1}$ and to the propagation direction 112.

Here, the acoustic substrate 410 is a quartz plate cut out along a cut with simple rotation $(Y_2X_2l)/\theta_2$ close or equal to the known cut and usually noted as AT of quartz, i.e. $(Y_2X_2l)/35°$, a cut for which the TCFB1 coefficient of the slow shear mode is positive or zero and that of the fast shear mode is negative.

The lithium niobate plate 406 and the quartz plate 410 are then laid out relatively to each other so that the slow and fast shear modes are excited simultaneously and preferably at a same efficiency level. For this purpose, the lithium niobate plate is placed so that the axes $Z'_i$, (i.e. the crystallographic respective axes $Z_i$ having rotated around $Y'_i$, the normal to the plate) of the lithium niobate (i equals 1) and of quartz (l equals 2) form together an angle of 45°.

Equivalently, it is recalled that a quartz plate having a cut with double rotation of the $(Y_2X_2lt)/\theta_2/45°$ type and superposed without any pivoting of the angle $\psi$ on the lithium niobate plate having a cut $(Y_1X_1l)/163°$, produces the same effect as that of two cuts with simple rotation, a cut $Y_2X_2l/\theta_2$ and a cut $(Y_1X_1l)/163°$ for lithium niobate, pivoted relatively to each other by a pivot angle with superposition of 45°.

Thus, in order to excite several vibration modes simultaneously, it is possible to use quartz with a cut orientation with double rotation, or with single rotation by adapting the crystallographic alignment of the transducer and of the substrate depending on the sought excitation mode.

Figure 15:
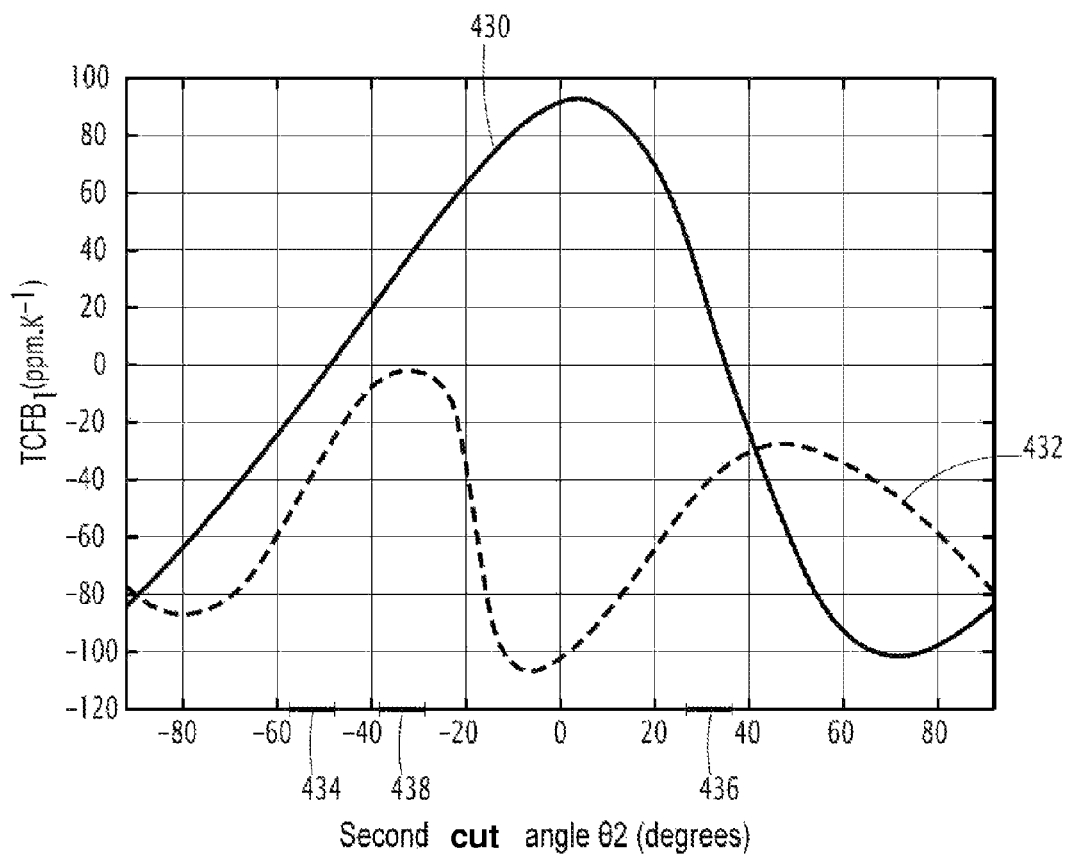
FIG. 15 is a view of the time-dependent change of the temperature coefficients of the frequency of the slow shear bulk waves in quartz cut along a cut with simple rotation $(Y_2X_2l)/\theta_2$ with $-90°<\theta_2<+90°$.

According to FIG. 15, the sensitivity to static thermal effects of the shear modes of quartz cut along the cut with simple rotation $(Y_2X_2l)/\theta_2$ is illustrated in the form of two temperature coefficients of the frequency of the first order TCFB1 and TCFB2 for an acoustic substrate 310 expressed in ppm·K$^{-1}$ (parts per million of the frequency per Kelvin), depending on the second cut angle $\theta_2$ expressed in degrees.

A first curve 430 in solid lines illustrates the time-dependent change of a first temperature coefficient of the frequency of the first order TCFB1 for so-called slow shear waves versus the second cut angle $\theta_2$.

A second curve 432 in dotted lines illustrates the time-dependent change of a second temperature coefficient of the frequency of the first order TCFB2 for so-called fast shear waves versus the second cut angle $\theta_2$.

The so-called rapid or rapid mode shear waves and the so-called slow or slow mode shear waves are defined as shear waves with orthogonal polarization, the so-called fast waves having a phase velocity greater than that of the so-called slow waves.

The curve 430 shows the existence of an angular area 434 in which the first temperature coefficient of the frequency of the first order TCFB1 forms slow shear waves equal to zero with sign inversion on either side. The angular area 432 is centered around the cut angle $\theta_2$ equal to −48 degrees (commonly called a BT cut angle) and has an amplitude of 22 degrees thereby guaranteeing a first temperature coefficient of the frequency of the first order TCFB1 in absolute value of less than 20 ppm·K$^{-1}$. A TCFB difference (TCFB1−TCFB2) between the slow mode and the fast mode is greater than 20 ppm·K$^{-1}$ in practice guaranteeing sensitivity of the temperature sensor of the order of the difference of TCFB, therefore in every case a sensitivity greater than or equal to 5 ppm·K$^{-1}$.

The curve 430 also shows the existence of an angular area 436 in which the first temperature coefficient of the frequency of the first order TCFB1 for slow shear waves is equal to zero with inversion of the sign on either side. The angular area 436 is centered around the cut angle $\theta_2$ equal to 35 degrees (commonly called an AT cut angle) and has an amplitude of 10 degrees thereby guaranteeing a first temperature coefficient of the frequency of the first order TCFB1 in absolute value of less than 20 ppm·K$^{-1}$. A TCFB difference (TCFB1−TCFB2) for quartz between the slow mode and the fast mode is greater than 10 ppm·K$^{-1}$ guaranteeing a sensitivity of the temperature sensor greater than or equal to 5 ppm K$^{-1}$.

The curve 430 also shows the existence of an angular area 438 in which the first temperature coefficient of the frequency of the first order TCFB1 for slow shear waves is close to zero and approaches zero in a smooth way. The angular area 438 is centered around the cut angle $\theta_2$ equal to −32 degrees and has an amplitude of 20 degrees thereby guaranteeing a first temperature coefficient of the frequency of the first order TCFB1 in absolute value of less than 20 ppm·K$^{-1}$. A TCFB difference (TCFB1−TCFB2) for quartz between the slow mode and the fast mode is greater than 30 ppm·K$^{-1}$ guaranteeing a sensitivity of the temperature sensor greater than or equal to 5 ppm·K$^{-1}$.

The advantage of operating in the vicinity of the compensation points, i.e. in the areas 434, 436, 438 is to optimize the extent of the working frequency band. This point is crucial for wireless applications where the extent of the ISM band (1.7 MHz at 434 MHz, 0.85 MHz at 868 MHz and 80 MHz at 2.45 GHz) reduces the degrees of freedom in terms of the spectral excursion of the frequency versus temperature.

The curve 432, as for it, shows that the second temperature coefficient of the frequency of the first order TCFB2 for fast shear waves remains negative.

When the second angle $\theta_2$ of the acoustic substrate is selected between −48 and 35 degrees (see FIG. 15), on this interval, the first temperature coefficient of the frequency of the first order TCFB1 for slow shear waves and the second temperature coefficient of the frequency of the first order TCFB2 for fast shear waves, are of opposite signs.

When the cut angle $\theta_1$ of the transducer 406 is selected in the area 22 (see FIG. 8) and when the second angle $\theta_2$ of the acoustic substrate is comprised between −48 and 35 degrees, the sensitivity frequency temperature difference (TCFB1−TCFB2) is greater than or equal to 25 ppm·K$^{-1}$, and the sensitivity of the sensor is greater than or equal to 20 ppm·K$^{-1}$.

It should be noted that, when the cut angle $\theta_2$ of the quartz is selected between −10 and 10°, the difference between the first temperature coefficient of the frequency of the first order TCFB1 for slow shear waves and the second temperature coefficient of the frequency of the first order TCFB2 for fast shear waves is maximum over this interval, greater than 100 ppm·K$^{-1}$, which allows the formation of a temperature sensor with very high resolution.

It should also be noted that, when the cut angle $\theta_2$ of quartz is selected between 35° and 45°, the difference between the first temperature coefficient of the frequency of the first order TCFB1 for slow shear waves and the second temperature coefficient of the frequency of the first order TCFB2 for fast shear waves varies over this interval from 40 to 1 ppm·K$^{-1}$, which allows fine adjustment of the value of the difference in order to cover, in particular in the case of wireless applications, extended temperature ranges in spite of the spectral restrictions related to the standards regulating such applications, in particular the ISM radiation standards.

For example, in order to measure the temperature over a range of 200° C. with a differential sensor in the ISM band centered on 434 MHz with a width of 1.7 MHz not providing wide areas with guard frequencies at high and low limits of the band used for observing the standards, the differential sensor sensitivity should be here of the order of 10 ppm·K$^{-1}$. In other examples, differential sensitivities of small values ranging up to 1 ppm·K$^{-1}$ may be required.

Figure 16:
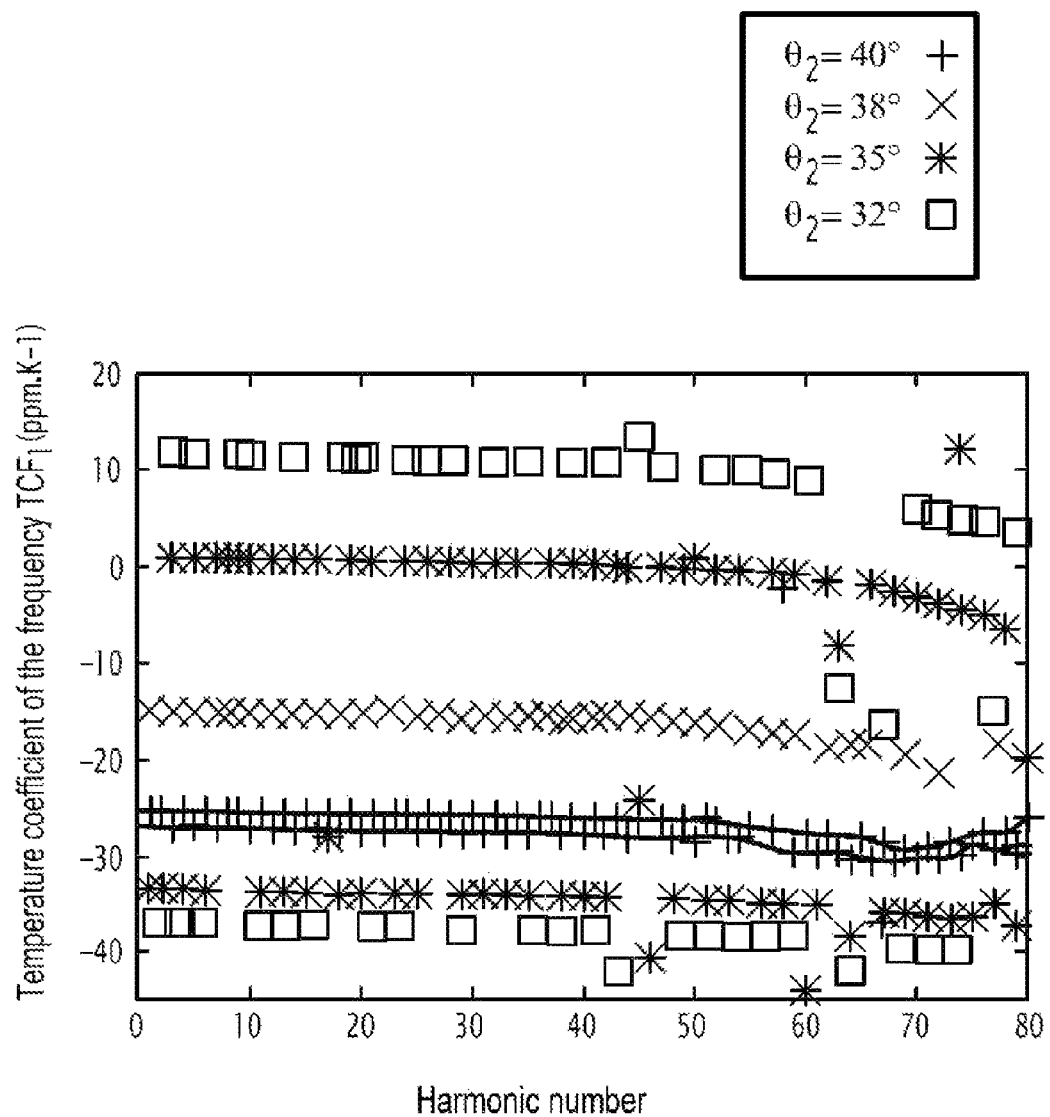
FIG. 16 is a view of the time-dependent change in parallel with a family parameterized by the first cut angle $\theta_2$, of pairs of frequency temperature coefficients associated with two vibration modes of different polarization versus harmonic modes of the stack of lithium niobate $(Y_1X_1l)/165°$ on quartz $(Y_2X_2lt)/\theta_2/45°$ with $\theta_2$ varying from 32 to 40°.

FIG. 16 shows the time-dependent change in the frequency temperature sensitivity shift of the TCF1 resonator between both excited transverse modes versus the quartz cut angle $\theta_2$ in the case of a lithium niobate stack $(Y_1X_1l)/165°$ on quartz $(Y_2X_2lt)/\theta_2/45°$ with $\theta_2$ being from 32° to 40° for a ratio of 1 µm of niobate over 50 µm of quartz.

The thermal sensitivity difference between both excitable modes in this structure is actually compliant with that of FIG. 15 and follows for a niobate thickness clearly less than that of the quartz substrate, i.e. a lithium niobate/quartz thickness ratio of less than or equal to 5%, the temperature law of the latter material.

A particular example of a configuration of the second embodiment is described below, intended for a wireless application, for which it is preferable to adapt the structure to operation in the ISM band, corresponding to the bands of frequencies which may be freely used for industrial, scientific or medical applications.

In order to determine such a configuration, first of all, for example a selection is made of a quartz cut $(X_2Y_2lt)$ 35°/45° with a thickness of 100 µm, associated with a niobate plate (YXl)/165° with a thickness of 3 µm. One also chooses to work in the ISM band centered on 433.9 MHz, with a band spread equal to 1.7 MHz. The two shear modes of the selected quartz cut have phase velocities close to V1 equal to 3,240 m/s and V2 equal to 3,700 m/s, respectively.

In order to localize the vibration modes in a narrow frequency band, harmonics should be able to be excited, for which the order ratio approaches the ratio of the mode velocities, i.e. 1.142. A ratio of harmonic orders is therefore needed, giving a value as close as possible to the latter, for example 8/7 equal to 1.1428.

Thus, for a stack observing the ratio of the layer thicknesses of the stack, here a ratio of niobate layer/quartz layer thicknesses equal to 0.01, all the modes for which the order ratio may be reduced to 8/7, for example 16/14, 24/21, will meet the stated criterion.

The order of one of the two modes and its operating frequency are then selected in order to determine the thickness of the quartz plate, being aware that the proposed approach only makes sense if the ratio of the thickness of the transducer over the thickness of the quartz plate is less than or equal to 0.05.

For example, for an operating frequency F1 equal to 434 MHz, and the modes of order 8 (N1) and 7 (N2), considering the slow mode, a t2 thickness equal to 0.5 N1.V1/F1 is found, i.e. equal to 29.78 µm. It is then possible to calculate the relative thicknesses of quartz and of niobate, t2 equal to 28.86 µm and t1 equal to 0.86 µm, respectively.

It will be noted that the calculation with the second mode gives a similar result: t2=0.5.N2.V2/F2=29.79 μm.

In practice, it is seen that manual adjustment of the thicknesses is required in order to adjust both modes in the ISM band as desired. The adopted practical values are 29.15 μm for the quartz layer and 1 μm for the niobate, always taking into account the two electrodes in aluminum and in gold each with a thickness of 100 nm, i.e. a thickness adjustment of less than 2% of the intended rated value. This is explained by the need of reducing the drift in the ISM band over the whole temperature range. This result is obtained by substantially modifying the quartz cut, which now has the value of 36.5°. This correction was only necessary for the quality of the illustration of the approach.

Figure 17:
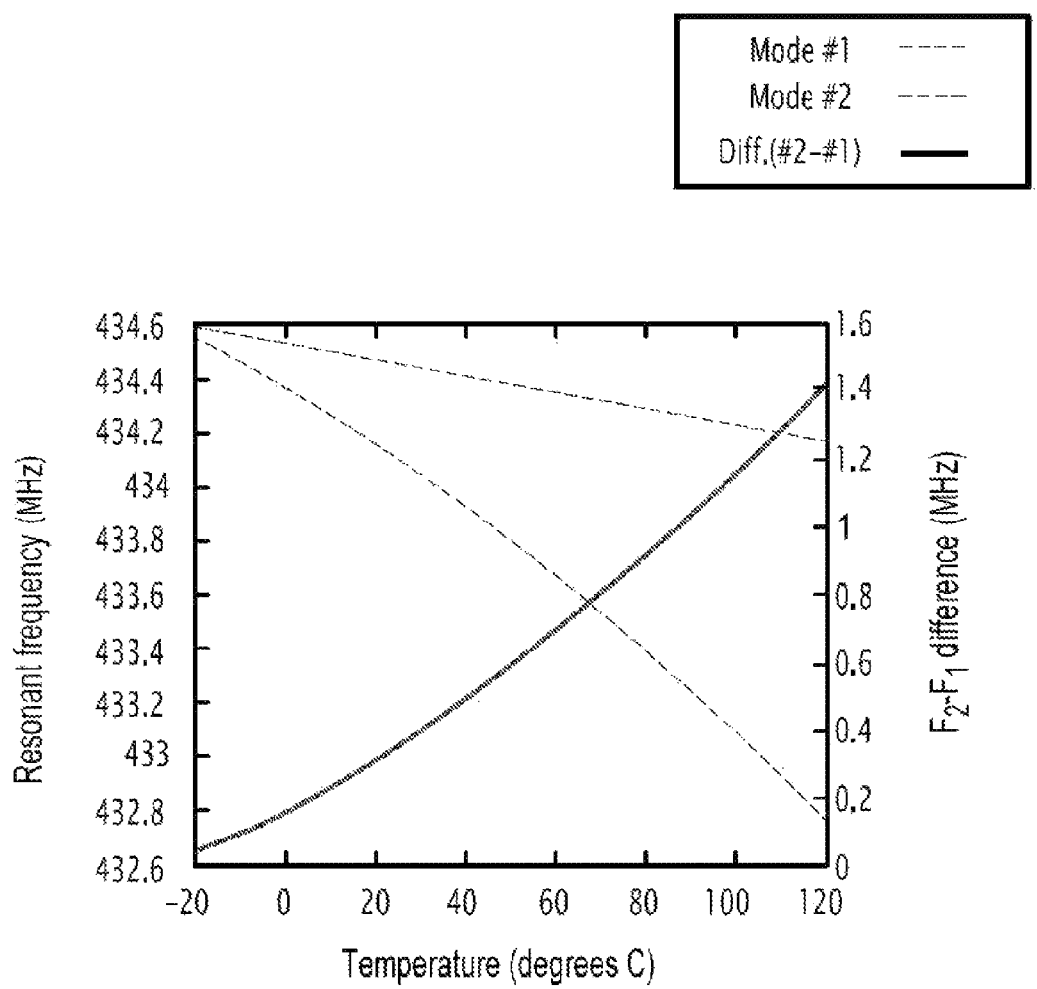
FIG. 17 is a view of the time-dependent change of two resonance frequencies of a resonator formed by a stack of lithium niobate and of quartz, configured so as to operate in the industrial, scientific and medical (ISM) band centered on 434 MHz, versus temperature.

FIG. 17 shows the results obtained in the form of resonant frequency curves versus temperature. The two frequencies well-localized in the ISM band up to 100° C. are seen with optimum use of the allowed band. However it is seen that the resonant frequency differential is quadratic, which imposes a calculation of the temperature according to sensitivity coefficients. Here, a law of the behavior of the frequency difference such as $\Delta F=0.1+7.5\cdot 10^{-3}\times T+2.5\cdot 10^{-5}\times T^2$ in MHz is obtained with T the temperature in degrees. This approach may be conducted with harmonics of higher order in order to alleviate the thickness constraint on layers and optimize the coupling coefficient of each mode.

Alternatively, the material in which the transducer is made is selected from aluminium nitride (AlN), zinc oxide (ZnO), lithium tantalate (LiTaO$_3$), potassium niobate, PZT, PbTiO$_3$, and generally piezoelectric ceramics with strong electromechanical coupling.

Alternatively, the material in which the substrate is made is selected from quartz, potassium niobate, lithium tantalate, gallium orthophosphate, lithium tetraborate, langasite, langatate and langanite.

For a given pair of materials as described above, respectively forming the transducer and the acoustic substrate, the crystallographic cuts and the relative positioning of the plates are determined in a similar way to what was described above so as to obtain differential drifts of frequencies on the terminals of the pair of electrodes clasping the transducer.

The invention claimed is:

1. A temperature sensor comprising a resonator of the high overtone bulk acoustic wave HBAR type intended to operate at a predetermined operating frequency and in a range of temperatures centered around a reference temperature $T_0$, the resonator including:

a piezoelectric transducer formed by a layer of a first thickness of a first material, cut according to a first transducer cut angle $\phi_1$ defined by the nomenclature (YXw)/$\phi$ of the IEEE Std-176 standard (revised in 1949) substantially equal to zero, and according to a second transducer cut angle $\theta_1$ defined by the nomenclature (YXl)/$\theta$ of the IEEE Std-176 standard (revised in 1949) such that the transducer has, either a first polarization direction $\vec{P}_{Along}$ of a first longitudinal vibration mode of the transducer, and a second polarization direction $\vec{P}_{Acis\_dual}$ of a second shear vibration mode of the transducer, or a single polarization direction $\vec{P}_{Acis\_seul}$ corresponding to a shear vibration mode of the transducer, and such that the electro-acoustic coupling of a shear vibration and/or of a longitudinal vibration for the material of the transducer is greater than or equal to 5%, an acoustic substrate formed by a layer of a second thickness of a second material having an acoustic quality coefficient/excitation frequency product at least equal to $5\cdot 10^{12}$, cut according to a first substrate cut angle $\theta_2$ defined by the nomenclature (YXl)/$\theta$ of the IEEE Std-176 standard (revised in 1949), cut according to a second substrate cut angle $\psi_2$ defined by the nomenclature (YXt)/$\psi$ of the IEEE Std-176 standard (revised in 1949), having at least two polarization directions from among a first polarization direction $\vec{P}_{B1}$, a second polarization direction $\vec{P}_{B2}$, a third polarization direction $\vec{P}_{long}$, respectively corresponding to a shear vibration mode of the acoustic substrate with a slow phase velocity, to a shear vibration mode of the acoustic substrate with a fast phase velocity, and to a longitudinal vibration mode of the acoustic substrate, a counter-electrode formed by a metal layer adhesively bonding a first face of the transducer and a face of the acoustic substrate, and an upper electrode positioned on a second face of the transducer opposite to the first face of the transducer and to the acoustic substrate, characterized in that the ratio of the first thickness over the second thickness is less than or equal to 0.05;

the cut angles $\phi_1$, $\theta_1$, $\psi_2$, $\theta_2$, and the acoustic relative positioning of the transducer and of the acoustic substrate are configured so that there simultaneously exists at least two vibration modes of the acoustic substrate, strongly coupled to a same extent with at least one vibration mode of the transducer, and that said at least two strongly coupled vibration modes of the acoustic substrate comprise a first vibration mode having a first temperature coefficient of the substrate frequency of the first order at the reference temperature $T_0$ and a second vibration mode of the acoustic substrate having a second temperature coefficient of the substrate frequency of the first order at the same reference temperature, and the transducer, for the first vibration mode of the acoustic substrate, has a first temperature coefficient of the transducer frequency of the first order at the reference temperature, and has for the second vibration mode of the acoustic substrate, a second temperature coefficient of the transducer frequency of the first order at the reference temperature, and the absolute value of the difference of the first and second temperature coefficients of the frequency of the resonator of the first order is greater than or equal to 1 ppm/° K, the first temperature coefficient of the frequency of the resonator of the first order being substantially equal to the sum of the first temperature coefficient of the frequency of the acoustic substrate of the first order and of the first temperature coefficient of the transducer frequency of the first order weighted by the relative thicknesses of each material relatively to the total thickness of the resonator, and the second temperature coefficient of the frequency of the resonator being substantially equal to the sum of the second temperature coefficient of the frequency of the acoustic substrate of the first order and of the second temperature coefficient of the transducer frequency of the first order weighted by the relative thicknesses of each material relatively to the total thickness of the resonator.

2. The temperature sensor according to claim 1, characterized in that
the piezoelectric transducer is cut according to a cut with a simple rotation $(X_1Y_1l)/\theta_1$ such that the transducer has a first polarization direction $\vec{P}_{Along}$ of a first longitudinal vibration mode of the transducer and a second polarization direction $\vec{P}_{Acis\_dual}$ of a second shear vibration mode of the transducer, and such that the electro-acoustic coupling of a shear mode wave and a longitudinal mode wave for this material is greater than 5%, et
the cut angles $\theta_1$, $\psi_2$, $\theta_2$, and the relative positioning of the transducer and of the acoustic substrate are configured so that
there simultaneously exists three vibration modes of the acoustic substrate, strongly coupled to a same extent with one of the two vibration modes of the transducer, and that
the three strongly coupled vibration modes of the acoustic substrate comprise a first slow shear vibration mode of the acoustic substrate, polarized along $\vec{P}_{B1}$ and having a first temperature coefficient of the substrate frequency of the first order at the reference temperature, a second fast shear vibration mode, polarized along $\vec{P}_{B2}$ and having a second temperature coefficient of the substrate frequency of the first order at the reference temperature, and a third longitudinal vibration mode, polarized along $\vec{P}_{long}$ and having a first temperature coefficient of the substrate frequency of the first order at the reference temperature,
the transducer for the first, second, third vibration modes of the acoustic substrate respectively has first, second, third temperature coefficients of the transducer frequency of the first order at the reference temperature,
the absolute value of the difference of any two temperature coefficients of the frequency of the resonator of the first order of a set formed by first, second and third temperature coefficients of the frequency of the resonator of the first order, is greater than or equal to 1 ppm/° K,
the first temperature coefficient of the frequency of the resonator of the first order is substantially equal to the sum of the first temperature coefficient of the frequency of the acoustic substrate of the first order and of the first temperature coefficient of the transducer frequency of the first order weighted by the relative thicknesses of each material relatively to the total thickness of the resonator, and
the second temperature coefficient of the frequency of the resonator being substantially equal to the sum of the second temperature coefficient of the frequency of the acoustic substrate of the first order and of the second temperature coefficient of the transducer frequency of the first order weighted by the relative thicknesses of each material relatively to the total thickness of the resonator, and
the third temperature coefficient of the frequency of the resonator being substantially equal to the sum of the third temperature coefficient of the frequency of the acoustic substrate of the first order and of the third temperature coefficient of the transducer frequency of the first order weighted by the relative thicknesses of each material relatively to the total thickness of the resonator.

3. The temperature sensor according to claim 1, characterized in that
the piezoelectric transducer is cut according to a cut with a simple rotation $(X_1Y_1l)/\theta_1$ such that the transducer has a first polarization direction $\vec{P}_{Along}$ of a first longitudinal vibration mode of the transducer and a second polarization direction $\vec{P}_{Acis\_dual}$ of a second shear vibration mode of the transducer, and such that the electro-acoustic coupling of a shear mode wave and of a longitudinal mode wave for this material is greater than 5%, and
the cut angles $\phi_1$, $\theta_1$, $\psi_2$, $\theta_2$, and the relative positioning of the transducer and of the acoustic substrate are configured so that
there simultaneously exists only two vibration modes of the acoustic substrate strongly coupled to a same extent with one of the two vibration modes of the transducer, and that
both strongly coupled vibration modes of the acoustic substrate comprise a first shear vibration mode of the acoustic substrate having a first temperature coefficient of the substrate frequency of the first order at the reference temperature, a second longitudinal vibration mode having a second temperature coefficient of the substrate frequency of the first order at the reference temperature
the transducer for the first, second vibration modes respectively has first and second temperature coefficients of the transducer frequency of the first order at the reference temperature,
the absolute value of the difference of first and second temperature coefficients of the frequency of the resonator of the first order is greater than or equal to 1 ppm/° K,
the first temperature coefficient of the frequency of the resonator of the first order being substantially equal to the sum of the first temperature coefficient of the frequency of the acoustic substrate of the first order and of the first temperature coefficient of the transducer frequency of the first order weighted by the relative thicknesses of each material relatively to the total thickness of the resonator, and
the second temperature coefficient of the frequency of the resonator being substantially equal to the sum of the second temperature coefficient of the frequency of the acoustic substrate of the first order and of the second temperature coefficient of the transducer frequency of the first order weighted by the relative thicknesses of each material relatively to the total thickness of the resonator.

4. The temperature sensor according to claim 1, characterized in that
the material of the piezoelectric transducer is lithium niobate or lithium tantalate and the transducer is cut according to a cut with simple rotation $(Y_1X_1l)/\theta_1$ in which the cut angle $\theta_1$ is an angle comprised between 0° and 25°.

5. The temperature sensor according to claim 1, characterized in that
the piezoelectric transducer is cut according to a cut with simple rotation $(X_1Y_1l)/\theta_1$ such that the transducer has a single polarization direction $\vec{P}_{Acis\_seul}$ corresponding to the shear vibration mode of the transducer, and such that the electro-acoustic coupling of a shear vibration and/or of a longitudinal vibration for the material of the transducer is greater than or equal to 5%, the cut angles $\theta_1$, $\psi_2$, $\theta_2$, and the relative positioning of the transducer and of the acoustic substrate are configured so that there simultaneously exists two shear vibration modes with different phase velocities, strongly coupled to a same extent with the transverse vibration mode of the transducer, and that both strongly coupled vibration modes of the acoustic substrate comprise a first slow shear vibration mode of the acoustic substrate having a first temperature coefficient of the substrate frequency of the first order at the reference temperature, a second fast shear vibration mode of the acoustic substrate having a second temperature coefficient of the substrate frequency of the first order at the reference temperature the angle formed between the single slow phase velocity shear polarization direction of the transducer and the fast phase velocity shear polarization direction of the acoustic substrate, and the angle formed between the single shear polarization of the transducer and the fast phase velocity shear polarization direction of the acoustic substrate are substantially equal and with a measurement equal to 45°;

the transducer for the first, second vibration modes respectively has first, second temperature coefficients of the transducer frequency of the first order at the reference temperature, the absolute value of the difference of first and second temperature coefficients of the frequency of the resonator of the first order is greater than or equal to 1 ppm/° K, the first temperature coefficient of the frequency of the resonator of the first order being substantially equal to the sum of the first temperature coefficient of the frequency of the acoustic substrate of the first order and of the first temperature coefficient of the transducer frequency of the first order weighted by the relative thicknesses of each material relatively to the total thickness of the resonator, and the second temperature coefficient of the frequency of the resonator being substantially equal to the sum of the second temperature coefficient of the frequency of the acoustic substrate of the first order and of the second temperature coefficient of the frequency of the transducer of the first order weighted by the relative thicknesses of each material relatively to the total thickness of the resonator.

6. The temperature sensor according to claim 5, characterized in that the material of the piezoelectric transducer is lithium niobate or lithium tantalate and the transducer is cut according to a cut with simple rotation $(Y_1X_1l)/\theta_1$ in which the cut angle $\theta_1$ is an angle comprised between 155 and 176°.

7. The temperature sensor according to claim 1, characterized in that a first temperature coefficient of the frequency of the acoustic substrate is substantially zero or of sign opposite to the second temperature coefficient of the frequency of the acoustic substrate.

8. The temperature sensor according to claim 1, characterized in that the cut of the acoustic substrate is such that the temperature coefficient of the frequency of the first order corresponding to said at least one shear mode of the acoustic substrate is substantially zero with inversion of its sign on either side of an angle defining the cut of the acoustic substrate.

9. The temperature sensor according to claim 1, characterized in that the temperature coefficient of the frequency of the first order of the acoustic substrate corresponding to at least one of the shear modes of the acoustic substrate is a local extreme in absolute value of less than 20 ppm·K$^{-1}$ and the variation of the temperature coefficient in the vicinity of this extreme is a smooth variation in absolute value of less than 2 ppm·K$^{-1}$/degree.

10. The temperature sensor according to claim 1, wherein
the material of the transducer is selected from aluminum nitride (AlN), zinc oxide (ZnO), lithium niobate (LiNbO$_3$), lithium tantalate (LiTaO$_3$), potassium niobate, PZT, PbTiO$_3$ and piezoelectric ceramics with strong electromechanical coupling, and
wherein the material of the acoustic substrate is selected from quartz, potassium niobate, lithium tantalite, gallium orthophosphate, lithium tetraborate, langasite, langatate and langanite.

11. The temperature sensor according to claim 1, wherein the counter-electrode is a heat-compressible metal, for example gold, copper or indium and the upper electrode is for example made in aluminum.

12. The temperature sensor according to claim 1, characterized in that
the piezoelectric transducer is made in lithium niobate; and
the material of the acoustic substrate is quartz and the acoustic substrate is cut according to a cut with simple rotation wherein the cut angle $\phi_2$ is zero, and $\theta_2$ is an angle comprised between −60 and 45 degrees.

13. The temperature sensor according to claim 12, wherein the cut angle $\theta_1$ of the $(Y_1X_1l)/\theta_1$ cut of lithium niobate is selected from an interval comprised between 160 and 170°, preferably 163°, and the cut angle $\theta_2$ of the $(Y_2X_2l)/\theta_2$ cut of the acoustic substrate is selected from between −48 and 35 degrees.

14. The temperature sensor according to claim 12, wherein the cut angle $\theta_2$ of the $(Y_2X_2l)/\theta_2$ cut of the acoustic substrate is selected from between −10 and 10°.

15. The temperature sensor according to claim 1, comprising a unit for determining the difference between a first resonance frequency and a second resonance frequency of the HBAR resonator at a temperature T prevailing within the resonator, measured between both electrodes of the same pair of the resonator, and
a unit for determining the temperature T of the resonator from the determined frequency difference and from a one-to-one function of the match between the temperature and the frequency difference.

* * * * *